United States Patent [19]

Koide et al.

[11] Patent Number: 5,780,845
[45] Date of Patent: Jul. 14, 1998

[54] OPTICAL CURRENT TRANSFORMER

[75] Inventors: Hidenobu Koide, Kawasaki; Toshihiko Yoshino, Urayasu, both of Japan

[73] Assignees: Toshihiko Yoshino, Chiba; Fuji Electric Co., Ltd., Kanagawa, both of Japan

[21] Appl. No.: 635,155

[22] Filed: Apr. 23, 1996

[30] Foreign Application Priority Data

Apr. 25, 1995 [JP] Japan .................................. 7-099075
Apr. 25, 1996 [JP] Japan .................................. 8-104891

[51] Int. Cl.⁶ .................................................. G01R 15/07
[52] U.S. Cl. .................... 250/227.17; 250/225; 324/96; 324/244.1
[58] Field of Search ................... 250/225, 227.17, 250/227.14, 227.18, 231.1; 342/96, 244.1

[56] References Cited

U.S. PATENT DOCUMENTS

| | | | |
|---|---|---|---|
| 4,255,018 | 3/1981 | Ulrich et al. | 250/227.17 |
| 4,931,635 | 6/1990 | Toyama | 250/227.17 |
| 4,947,107 | 8/1990 | Doerfler et al. | 250/227.17 |
| 5,448,291 | 9/1995 | Wickline. | |

FOREIGN PATENT DOCUMENTS

| | | |
|---|---|---|
| 650066 | 4/1995 | European Pat. Off. . |
| 92558 | 11/1968 | France . |
| 58-153174 | 9/1983 | Japan . |
| 2-52827 | 2/1990 | Japan . |

OTHER PUBLICATIONS

Patent Abstracts of Japan, vol. 008, No. 033 (P-254), 14 Feb. 1984 & JP-A-58 189568 (Hitachi Seisakushi KK), 5 Nov. 1983.

ISA Transactions, vol. 28, No. 2, 1 Jan. 1989, US, pp. 15–17, XP000112434 Day G W et al.: "Optical fiber sensors for electromagnetic quantities".

Proc. Wescanex '95 Communications, Power, and Computing, vol. 2, 15–16 May 1995, US, pp. 329–333, XP000602982, J. Song et al.: "A Faraday Effect Based Clamp–on Magneto–optical Current Transducer for Power Systems".

Database Inspec, Insitute of Electrical Engineers, Stevenage, GB, Inspec. No. AN–4784772, XP002014758 & Proc. Conf. on Precision Electromagnetic Measurements Digest, Jun. 27, 1994–Jul. 1, 1994, US, p. 459–460, J. Song et al.: "Development of a clamp–on magneto–optical current transducer for power systems".

Sensors and Actuators A, vol. A39, No. 3, 1/Dec./1993, CH, pp. 219–224, XP000430610, Ning Y N et al: "Review of optical current sensors using bulk–glass sensing elements".

*Primary Examiner*—Edward P. Westin
*Assistant Examiner*—John R. Lee
*Attorney, Agent, or Firm*—Pearne, Gordon, McCoy and Granger LLP

[57] ABSTRACT

In an optical current transformer, an optical sensor is made up of two optical sensor units which are independent of each other. Incident light beams are applied to the optical sensor units, and the emergent light beams from the latter are subjected to addition, to obtain a measurement signal which is proportional to a current under test which flows in a conductor. The optical sensor units are substantially U-shaped bars, which are Faraday effect glass bars which are rectangular in cross section and have 45° reflecting surfaces at the corners.

23 Claims, 18 Drawing Sheets

FIG. 19C
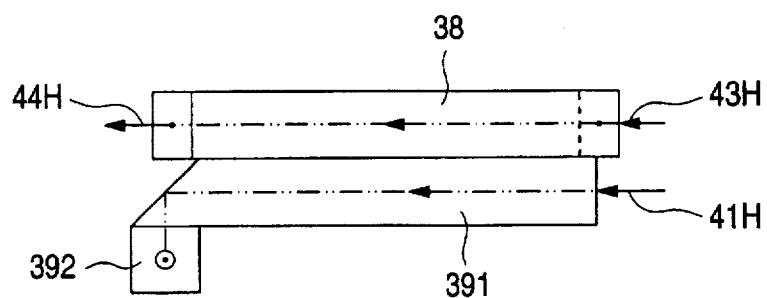
FIG. 19D
FIG. 19A
FIG. 19B
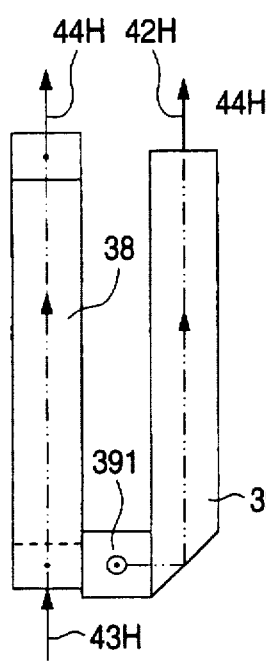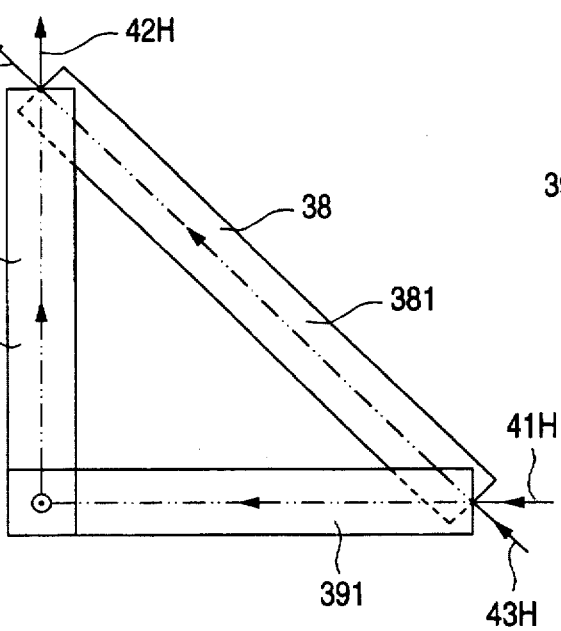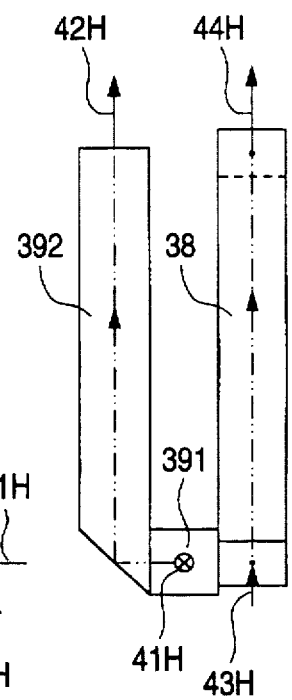
FIG. 19E
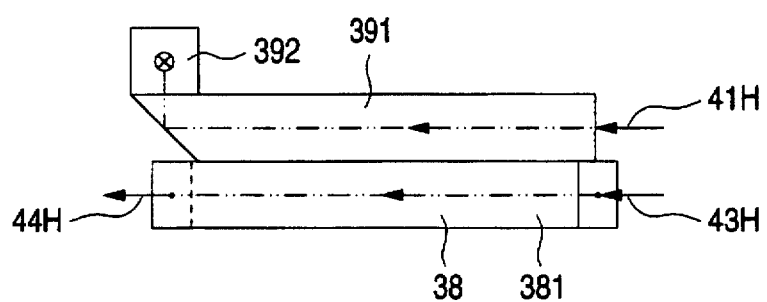

OPTICAL CURRENT TRANSFORMER

BACKGROUND OF THE INVENTION

This invention relates to an optical current transformer which is operated on the "Faraday effect" that the direction of polarization of a light beam passing through a glass material is turned by the effect of a magnetic field, so as to measure a relatively large current which flows in a high voltage conductor such as a gas-insulated switch device.

Current measurement can be achieved on the basis of the "Faraday effect" that a plane of polarization is turned in a magnetic field. Roughly stated, the principle is as follows: When a linearly polarized light beam passes through a glass material such as a lead glass material showing the Faraday effect (hereinafter referred to as "a Faraday effect glass", when applicable) which is set in a magnetic field formed by a current, the plane of polarization is turned through an angle θ=V H L (where V is Verdet's constant, H is the magnetic field strength in the direction of advancement of light, and L is the glass length in the same direction). The turn of the plane of polarization is detected by a conventional method to obtain the magnetic field strength H, thereby to measure the current flowing near the Faraday effect glass.

In general, in an ordinary current measuring site, a plurality of conductors are laid. Hence, the measurement is affected by the magnetic fields which may be formed by currents other than a current flowing in a conductor under measurement. In order to overcome this difficulty, an optical current transformer has been proposed in the art in which a through-hole is formed in a single Faraday effect glass member at the center, and a conductor under current measurement is inserted into the through-hole thus formed, so that an optical path is formed which goes around the conductor and passes through the Faraday effect glass member (the Unexamined Japanese Patent Application Publication No. Sho. 58-153174).

FIG. 22 is a perspective view showing the Faraday effect glass member of an optical current transformer disclosed by the aforementioned Japanese Patent Application No. Sho. 58-153174, and a conductor extended through the glass member.

In FIG. 22, reference numeral 1 designates an optical sensor which is substantially square and has a through-hole 11 at the center. A conductor 100 is extended through the through-holes. The lower right portion of the optical sensor 1 is formed into a light incident/emergent section 16. Linearly polarized incident light beam 17 is applied to the section 16 from below. The light beam thus applied is advanced along an optical path (described later) and along the periphery of the optical sensor 1, and is then taken, as an emergent light beam 18, out of the optical sensor 1. In FIG. 22, a light emitting unit for emitting the incident light beam 17, and a detector for processing the emergent light beam 18 are not shown.

The peripheral surface of the optical 1 is shaped for instance as follows: The upper horizontal surface is bent 45° downwardly along the central line (defining a half of the thickness), thus having a sloped surface 12. The remaining three sides are also cut in the same manner (described later).

FIG. 23 is a projection diagram, showing the optical sensor 1 in detail. FIG. 23A is a front view as viewed substantially in the same direction as in FIG. 22, and FIGS. 23B and 23E are side views formed according to the trigonometry. More specifically, FIGS. 23B to 23E are side views of the optical sensor (shown in FIG. 23A) as viewed from right, above, left and below, respectively. Each of the four sides of the optical sensor, has a 45° sloped surface as was described above. That is, in FIG. 23A, the upper side has a sloped surface 12; the left side, a sloped surface 13; the lower side, a sloped surface 14, and the right side, a sloped surface 15. In FIG. 23, the optical path is indicated by the two-dot chain lines, and incident and emergent light beams, and light reflecting points are indicated with small alphabetical letters. The incident light beam a is equal to the light beam 17 shown in FIG. 22. The light beam a enters the sensor through the surface which is not sloped, and therefore it is perpendicular to the surface of the optical sensor, and it is maintained unchanged in the direction of advancement, not being refracted, and its reflection by a boundary surface is minimum.

The incident light beam a is straightly advanced upwardly in FIG. 23, towards the upper right corner, and is reflected from the sloped surface 12 at the point b. The angle of incidence of the light beam into the sloped surface 12 is 45°. The refractive index of lead glass forming the optical sensor 1 is 1.8° in maximum, and 1.5° in minimum. Hence, in the optical sensor, a light beam applied to a surface at an angle of 45° is totally reflected. Hence, the light beam applied to the point b in the slope surface 12 is totally reflected; that is, its direction, being bent at right angles, is changed in the direction of thickness of the optical sensor 1. The light beam, as shown in FIG. 23D, is applied to the sloped surface 15 at the point c, thus being reflected. As a result, its direction is changed again. That is, as shown in FIGS. 23 A and 23C, it is in parallel with the upper side, thus advancing towards the upper left corner in FIG. 23A. Thereafter, similarly, at the upper left corner, the light beam is reflected twice from the sloped surface 13 at the point d and from the sloped surface 12 at the point e. Thus, the light beam is advanced downwardly. The light beam thus advanced is subjected to total reflection at the lower left corner; more specifically, it is totally reflected from the sloped surface 14 at the point f and from the sloped surface 12 at the point g. The resultant light beam is advanced to the right in FIG. 23, thus becoming an emergent light beam corresponding to the emergent light beam 18 in FIG. 22.

As was described above, the light beam is applied to one of the corners of the square optical sensor 1, and at each of the corners it is subjected to total reflection twice while changing its direction at right angles. As a result, the light beam advances along the four sides of the square optical sensor once, and emerges from the position which is closed to the light incident position, thus go around the through-hole 11.

The circumferential integration of the magnetic field formed by a current under test which flows in the conductor extended through the through-hole 11 is proportional to the current flowing in the conductor irrespective of the circumferential path thereof. Hence, in the case where the light beam is turned along the optical path once, the angle of rotation in the direction of polarization of the light beam is proportional to the current in the conductor. The process that the light beam is subjected to total reflection twice at each corner, is to prevent the linearly polarized light beam from being converted into an elliptically polarized light beam. Even if the incident light beam is an ideally linearly polarized light beam, the reflected light beam may become an elliptically polarized light in the case where the total reflection is carried out only once. In order to eliminate this phenomenon, the total reflection is carried out twice in suitable combination. That is, the distortions in polarization are canceled out by performing the total reflection twice, so that even after the light beam is reflected, its linear polarization is maintained. The performance of the total reflection twice is for the above-described purpose. In this case, during the period of from the first total reflection to the second total reflection, the light beam is an elliptically polarized light beam. Hence, if during this period, the angle of polarization is turned by the magnetic field, then after the second total reflection, the light beam is not a linearly polarized light beam any longer, and instead it is elliptically polarized to a slight extent. Hence, it is desirable that, in FIG. 23B, the distance between the points b and c is as short as possible. On the other hand, depending on a device equipped with the optical current transformer, currents flow in the plurality of conductors in the same direction, and therefore the component of the magnetic field in the direction of thickness of the optical sensor 1 is, in general, small to the extent that it can be disregarded. Hence, generally the above-described problem or phenomenon will never occur with the actual product. Hereinafter, the section where the total reflection is carried out twice is called as "twice total reflection section".

The above-described optical sensor 1 is formed by cutting a piece of glass material. However, a kind of optical sensor may be formed by laying four Faraday effect glass bars along four sides of a square each of which is square in cross section and has a reflecting surface which is inclined 45° (hereinafter referred to as "a 45° reflecting surface", when applicable), so that it has the same optical path as the above-described optical sensor 1 (cf. 1982 National Convention, Institute of Electrical Engineers of Japan, Papers 1293 "Portable Current Transformer").

FIG. 24 is a block diagram of a conventional optical transformer. In the optical transformer, a light emitting unit 21 output a light beam, which is applied through an optical fiber cable 22 to a polarizer 28, where it is converted into a linearly polarized light beam. The linearly polarized light beam is applied to the optical sensor 1 shown in FIGS. 22 and 23, where its polarizing angle is changed in proportion to a current under test. The output light beam of the optical sensor 1 is applied through an analyzer 29 which is different 45° in polarizing angle from the polarizer 28, and then through an optical fiber cable 23 to a detector 20. In the case of the output light beam of the optical sensor, its polarizing angle is only changed in proportion to the instantaneous value of the current under test (to be measured); however, the intensity of the light beam passed through the analyzer 29 is a pulsating current containing an alternating current component (hereinafter referred to as "an AC component", when applicable) which is proportional to the instantaneous value of the current under test.

The detector 20 comprises: a photo-electric converter 24 for converting its input light beam into an electrical signal in proportion to its intensity; a direct current component removing filter 26 for removing a direct current component (hereinafter referred to as "a DC current", when applicable) from the output signal of the photo-electric converter 24; and an amplifier 27 for suitably amplifying the alternating current from which the DC component has been removed; that is, a signal proportional to the current under test.

The output signal of the optical current transformer is applied to an indicating instrument, relay, etc. Therefore, it should have a certain amplitude. For this purpose, the amplifier 27 is employed. On the other hand, a practical optical current transformer is so designed that the intensity of the light beam outputted by the light emitting unit 21 is not affected by the output signal of the detector 20; for instance, the AC component is divided by the DC component, or the AC component is fed back to the light emitting unit 21 so that the DC component is maintained constant at all times. Hereinafter, detailed descriptions of those elements, and other elements which do not directly concern the realization of the invention will be omitted.

As was described above, the conventional optical sensor 1 is so designed as to surround the conductor 100 in which a current to be measured flows. Hence, in mounting the optical sensor 1 on a product, it is necessary to remove a connecting section (not shown in FIG. 22) from the conductor 100. During the manufacture of the product, it can be achieved with ease to couple the optical sensor to the product; however, it is difficult, at worst impossible, to couple it to the product which has been installed. On the other hand, in the case where it is required to remove the optical sensor for some purpose, its removal is considerably difficult for the same reason described above. This difficulty may be eliminated by employing the following method: The optical sensor is so designed that it can be divided into two parts, and those two parts are combined together when it is coupled to the product. However, the method is not practical, because it is considerably difficult, or practically impossible, to align the optical axes of them with each other.

SUMMARY OF THE INVENTION

Accordingly, an object of he invention is to eliminate the above-described difficulties accompanying a conventional optical current transformer. More specifically, an object of the invention is to provide an optical current transformer in which an optical sensor is divided into two parts; however, it is unnecessary to align their optical axes with each other.

The foregoing object of the invention has been achieved by the provision of an optical current transformer comprising: an optical sensor made up of Faraday effect glass bars, thus forming a rectangular optical path which surrounds a conductor in which a current to be measured flows; a light emitting unit for emitting a light beam, the light beam being applied to a polarizer, where the light is converted into a linearly polarized light beam which is applied to the optical sensor; and a detector which receives an emergent light beam through analyzer from the optical sensor, and outputs an electrical signal proportional to the current to be measured, in which, according to the invention, the optical path is divided into parts, the optical sensor is made up of at least two optical sensor units which form the parts of the optical path thus divided, a linearly polarized light beam is applied to each optical sensor unit, and polarized components proportional to the current which are included in the output light beams of the optical sensor units are subjected to addition, to obtain a measurement signal.

Hence, it is unnecessary to align the optical axes of the optical sensor units with each other, and the addition of the polarized components included in the output light beams of the optical sensors results in the detection of a measurement signal which is substantially equal to that which is obtained with the optical sensor set around the conductor in which the current to be measured flows.

Furthermore, in the optical current transformer, two opposite sides of the rectangular optical path are cut to obtain two U-shaped optical paths. The two U-shaped optical paths are made up of optical sensor units which are independent of each other. And, the optical sensors units are so arranged that the optical sensor units are shifted a predetermined distance from each other in a predetermined direction. This arrangement provides spaces necessary for the incidence of light, and the emergence of light.

In this case, the light incidence surfaces of the optical sensor units are perpendicular to the longitudinal directions of the Faraday effect glass bars having the light incidence surfaces. Hence, the resultant optical sensor unit is simplest in structure.

In the case where the light incidence surfaces of the optical sensor units are made in parallel with the longitudinal directions of the Faraday effect glass bars having the light incidence surfaces, and those Faraday effect glass bars have the 45° reflecting surfaces on the ends which are opposite to the ends where the light incidence surfaces are formed, the incident light beams, being reflected by the reflecting surfaces, are allowed to advance in parallel with the sides. In this case, the incident light beams are applied to the optical sensor units are in the same direction. If, in this case, the optical sensor is so designed that the linearly polarizing angles of the incident light beams are in parallel with the reflecting surfaces, then it hardly occurs that the light beams are converted into elliptically polarized beams when reflected by the reflecting surfaces.

In the case where L-shaped optical sensor units correspond to two L-shaped optical paths which is obtained by cutting a rectangular optical path at two diagonally opposite vertexes, the number of twice total reflection sensors is two which is a half of that in the case of the optical sensor made up of two U-shaped optical sensor units which are obtained by cutting two parallel (opposite) sides of the rectangular optical path.

In the case where the light incidence surface of each of the optical sensor units is perpendicular to the longitudinal direction of the Faraday effect glass bar having that light incidence surface, the optical sensor unit is simplest in structure.

In the case where the light incidence surface of one of the optical sensor units is perpendicular to the longitudinal direction of the Faraday effect glass bar having that light incidence surface, while the light incidence surface of the other optical sensor unit is in parallel with the longitudinal direction of the Faraday effect glass bar having that light incidence surface, and as shown in FIG. 12, only the latter of those Faraday effect glass bars has the 45° reflecting surface on their ends which are opposite to the ends where the light incidence surfaces are formed, the incident light beams of the optical sensor units can be made equal in direction with each other. In addition, in the case where the light incidence surfaces of the optical sensor units are in parallel with the longitudinal directions of the Faraday effect glass bars having the light incidence surfaces, and those Faraday effect glass bars have 45° reflecting surfaces on their ends which are opposite to the ends where the light incidence surfaces are provided, the incident light beam applied to each Faraday effect glass bar is advanced longitudinally of the latter being reflected by the reflecting surface. In this case, similarly as in the above-described case, the incident light beams of the optical sensor units can be made equal in direction with each other.

In the optical current transformer comprising: the optical sensor made up of the Faraday effect glass bars forming the optical path which surround the conductor in which a current to be measured flows; the light emitting unit for emitting a light beam, the light beam being applied to a polarizer, where the light beam is converted into a linearly polarized light beam which is applied to the optical sensor; and the detector which receives the emergent light beam through the analyzer from the optical sensor, and outputs an electrical signal proportional to the current to be measured, the optical path is in the form of a right-angled triangle, the optical sensor comprises: the first optical sensor unit whose optical path corresponds to two sides of the right-angled triangle which form right angles, and the second optical sensor unit whose optical path corresponds to the oblique line of the right-angled triangle, linearly polarized light beams are applied to the optical sensor units, respectively, and polarization components which are contained in the emergent light beams of the optical sensor units and are proportional to a current to be measured are subjected to addition, to obtain a measurement signal, whereby the twice total reflection occurs at only one place.

In the optical current transformer, the optical path may be substantially in the form of a rectangular equilateral triangle. In this connection, the Faraday effect glass material to be used is used least in quantity in the case where the conductor around which the optical path is formed is circular or square in cross section.

Furthermore, in the optical current transformer, the light incidence surfaces of the optical sensor units may be perpendicular to the longitudinal directions of Faraday effect glass bars having the light incidence surfaces. In this case, similarly as in the case where the optical path is rectangular, the optical sensor units are simplest in structure.

In addition, in the optical current transformer, the optical unit may be so designed that the light incidence surfaces of the optical sensor units are in parallel with the longitudinal directions of the Faraday effect glass bars having the light incidence surfaces, and those Faraday effect glass bars may have 45° reflecting surfaces on their ends which are opposite to the ends where the light incidence surfaces are provided, so that the incident light beam applied to each Faraday effect glass bar is advanced longitudinally of the Faraday effect glass bar being reflected by the reflecting surface. In this case, the incident light beam of the optical sensor units are equal in direction with each other.

Moreover, the optical current transformer may be so designed as follows:
In the case where one of the Faraday effect glass bars has an end cut 45°, which is so positioned as to intercept the incident light beams to the other Faraday effect glass bar, the end thus cut of the firstly mentioned Faraday effect is partially cut. This is effective in setting the incident light beams of the optical sensor units closer to each other in planar position.

BRIEF DESCRIPTION OF THE DRAWINGS

FIG. 2 is a projection diagram of the optical sensor shown in FIG. 1. More specifically.

FIG. 8 is a projection diagram of the optical sensor shown in FIG. 7. More specifically.

FIG. 15 is a projection diagram of the optical sensor shown in FIG. 14. More specifically, FIGS. 15B to 15F are side views.

FIG. 19 is a projection diagram of the optical sensor shown in FIG. 18. More specifically, FIG. 19A is a plan view of the optical sensor, and the remaining FIGS. 19B to 19E are side views.

FIG. 23 is a projection diagram of the optical sensor shown in FIG. 22. More specifically.

DETAILED DESCRIPTION OF THE PREFERRED EMBODIMENTS

Now, the invention will be described with reference to its preferred embodiments.
(Embodiment 1)

Figure 1:
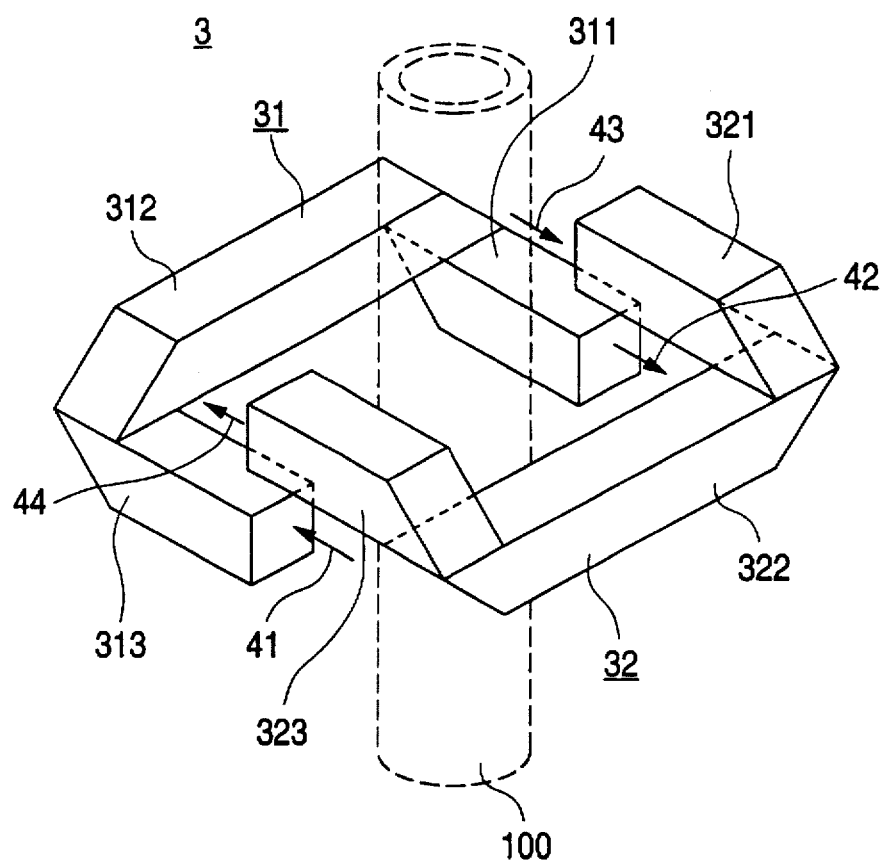
FIG. 1 is a perspective view of an optical sensor in an example of an optical current transformer, which constitutes a first embodiment of the invention.

FIG. 1 is a perspective view showing an optical sensor in an optical current transformer, which constitutes a first embodiment of the invention. As shown in FIG. 1, the optical sensor 3 is made up of two U-shaped optical sensor units 31 and 32. Those sensor units form a space into which a conductor 100 (indicated by the broken lines in FIG. 1) is inserted. The optical sensor unit 31 is made up of Faraday effect glass bars 311, 312 and 313 which are each rectangular in cross section. Those glass bars have 45° reflecting surfaces at the ends where they are abutted against each other. Hence, the optical sensor is equal in the above-described conventional optical sensor 1 in that a light beam passing through the glass bar changes the direction of its optical path 90° being reflected from the reflecting surface. The two Faraday effect glass bars 311 and 313, which correspond to two sides of the U-shaped optical sensor 31, have two ends, respectively, which are located away from (not in contact with) both ends of the remaining Faraday effect glass bar 312. Those two ends are surfaces perpendicular to the aces of the two glass bars 311 and 313, thus serving as in incident light surface and an emergent light surface. In FIG. 1, an incident light beam 41 indicated by the arrow is applied to the incident light surface of the Faraday effect glass bar 313, and an emergent light beam 42 is allowed to emerge from the emergent light surface of the Faraday effect glass bard 311.

The other optical sensor unit 32 can be obtained by turning the optical sensor unit 31 through 180° clockwise in FIG. 1. That is, the unitary optical sensor 32 is made up of the same components as the optical sensor unit 31. Hence, where the Faraday effect glass bars 313 and 323 are equal in longitudinal length, then they are completely equal in dimension and in configuration. The same thing may be said about the Faraday glass bars 311 and 321 and Faraday glass bars 312 and 322. Hence, the optical sensor 3 can be formed of two kinds of components; the first components are the Faraday effect glass bars 312 and 322 each of which has 45° reflecting surfaces at both ends, and the second components are the Faraday effect glass bars 311, 313, 321 and 323 which have the incident light surfaces and the emergent light surfaces as was described above.

In FIG. 1, the optical sensor units 31 and 32 are shown spaced away in a vertical direction. However, in the vertical direction, that is, in the direction of flow of a current to be measured, those optical sensors 31 and 32 should be set as close to each other as possible. If the distance between the incident light beam 41 and the emergent light beam 33, and the distance between the incident light beam 43 and the emergent light beam 42, are different with respect to a precise circumferential optical circuit, and if a vertical magnetic field component exists, then the resultant measurement may involve an error. In practice, the conductor in which the current to be measured flows is extended vertically, and therefore the magnetic field component in the direction of flow of the current under test is, in general, so small that it can be disregarded. At any rate, the distance between the two optical sensor units 31 and 32 should be as short as possible. That is, all that is necessary here is to provide spaces for installation of metal terminals of optical fibers for the incident and emergent light beams 41, 42, 43 and 44.

FIG. 2 is a trigonometric projection diagram of the optical sensor 3 shown in FIG. 1. More specifically, FIG. 2A is a plan view of the optical sensor; and FIG. 2A to 2E are a right side view, a upper side view, a left side view, and a lower side view of the optical sensor, respectively. As shown in FIG. 2, the positional relationships between the optical sensor units 31 and 32 are such that the incident and emergent light surfaces of each optical sensor unit are in one plane, and are shifted from each other as much as the thickness of the Faraday effect glass bar. In FIG. 1, the incident and emergent light surfaces are shifted slightly larger than the thickness of the Faraday effect glass bar; however, in FIG. 2, they are shifted just as much as the thickness. That is, the optical sensor units are so arranged that the incident and emergent light surfaces are in contact with one another at the corners.

In the unitary optical sensor 32, its optical path is indicated by the two-dot chain line similarly as in the case of FIG. 23. That is, the incident light beam 32 enters the Faraday effect glass bar 321 through the incident and emergent light surface perpendicular to the optical axis of the Faraday effect glass bar 321, and is reflected from its reflecting point B, thus entering the Faraday effect glass bar 322. The light beam thus entered is reflected from its reflecting point C, thus advancing longitudinally of the Faraday effect glass bar 323. The light beam thus advanced is reflected from the other reflecting point D, thus entering the Faraday effect glass bar 323. The light beam thus entered is reflected at the reflecting point E so the Faraday effect glass bar 323, thus advancing longitudinally of the Faraday effect glass bar 323. Finally, the light beam thus processed is allowed to emerge as an emergent light beam 33, from the incident and emergent surface. In the case of the optical sensor unit 31, the light beam advances in the same manner as in the above-described case of the optical sensor unit 32 (its optical path not shown).

Figure 2C:
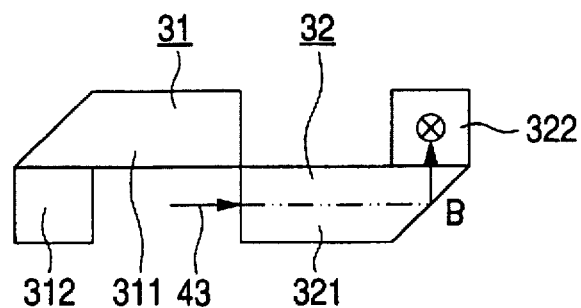
FIG. 2B to 2E are side views thereof.
Figure 2D:
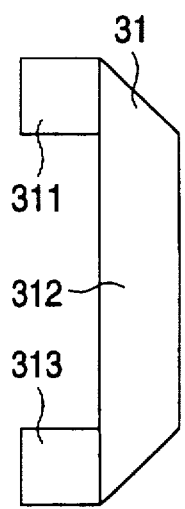
Figure 2A:
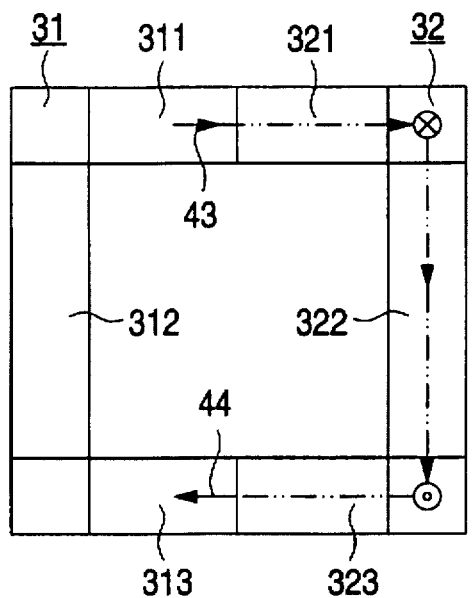
FIG. 2A is a plan view of the optical sensor, and the remaining
Figure 2B:
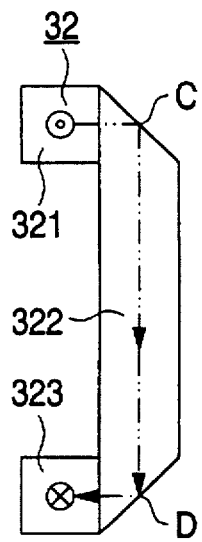
Figure 2E:
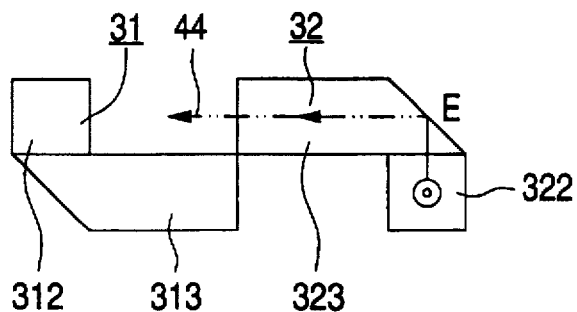

When the optical paths of the two optical sensor units 31 and 32 are connected to each other, then an optical path is formed which goes around the conductor 100 (shown in FIG. 1). The optical path projected on a plane perpendicular to the conductor 100 is as shown in FIG. 2A. The optical paths of the optical sensor units 31 and 32 form an optical path which goes fully around the conductor. As was described above, the incident light beam 41, the emergent light beam 44, the emergent light beam 42, and the incident light beam 43 takes the same positions on the incident and emergent light surfaces.

Figure 3:
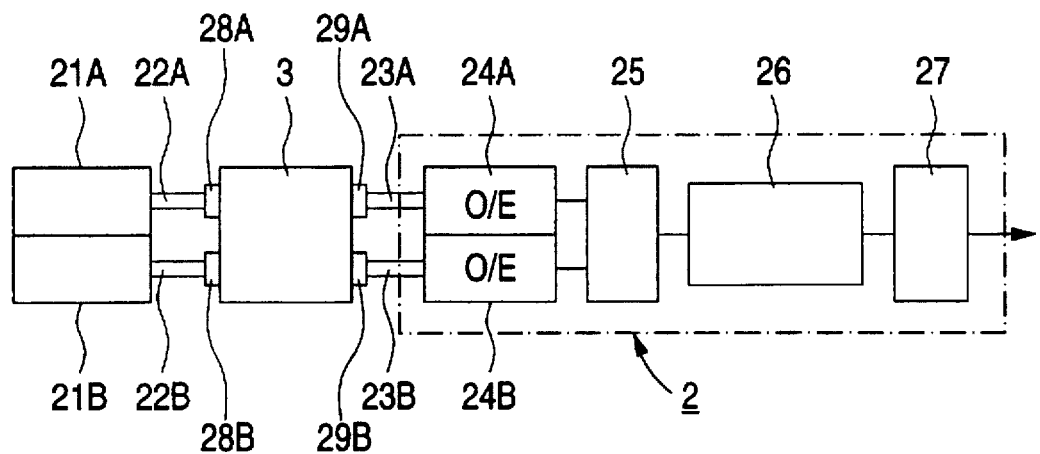
FIG. 3 is a block diagram of the optical current transformer employing the optical sensor shown in FIG. 1.

FIG. 3 is a block diagram showing the arrangement of a current transformer employing the optical sensor shown in FIGS. 1 and 2. FIG. 3 is different from FIG. 24 in that incident light beams and emergent light beams of the optical sensor 3 are arranged in parallel.

Two light emitting units 21A and 21B emit two output light beams, which are applied respectively through optical fibers 22A and 22B and polarizer 28A and 28B to the optical sensor 3. As a result, two output light beams emerge from the optical sensor 3, and they are applied respectively through analyzers 29A and 29B and optical fibers 23A and 23B to a detector 2. In the detector 2, those emergent light beams are received by photo-electric converters 23A and 24B, where they are converted into electrical signals, which are subjected to adder 25. That is, the electrical signals are subjected to addition. Thereafter, similarly as in the case of the detector 20 of the conventional optical current transformer (shown in FIG. 24), the output of the adder is applied to a direct current (DC) component removing filter 26, so that DC components are removed from the output of the adder. The output of the filter 26 is suitably amplified by an amplifier 27.

Figure 24:
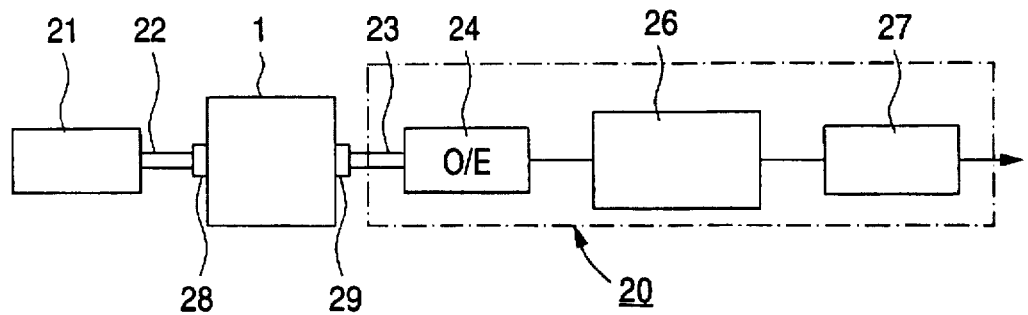
FIG. 24 is a block diagram showing the arrangement of an optical current transformer equipped with the optical sensor shown in FIG. 22.

As was described with reference to FIG. 24, in order that the result of measurement may not be affected by the variation in intensity of the incident light beam, the intensity of the emergent light beam is adjusted (controlled), or the AC component is divided by the DC component. This technique may be applied to the optical current transformer of the invention. In this connection, it should be noted that, in the case where, before addition of the AC components, the AC components are divided by the respective DC components, the adder shown in FIG. 3 should be connected between the DC component removing filter 26 and the amplifier 27.

(Embodiment 2)

Figure 4:
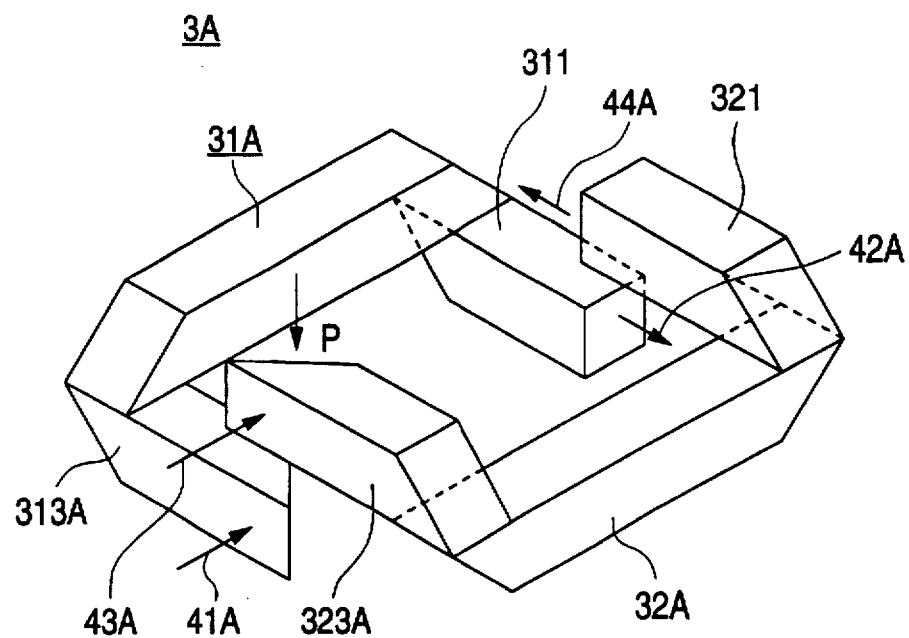
FIG. 4 is a perspective view of an optical sensor in another example of the optical current transformer, which constitutes a second embodiment of the invention.

FIG. 4 is a perspective view showing another example of the optical sensor, which constitutes a second embodiment of the invention. In FIG. 4, parts corresponding functionally to those already described with reference to FIG. 1 are therefore designated by the same reference numerals with the suffix character "A" when applicable. The optical sensor 3 shown in FIG. 1 in the following point: In the optical sensor 3A, an incident light beam 41A to a optical sensor unit 31A, and an incident light beam 43A to an optical sensor unit 32A are applied in directions perpendicular to the longitudinal directions of the respective Faraday effect glass bars. Accordingly, the Faraday effect glass bars 313A and 323A have 45° reflecting surfaces at the ends to turn the direction of advancement of the light beams, so that the latter advances longitudinally of the glass bars. After the incident light beams 41A and 43A, being reflected from the reflecting surfaces, are changed in the direction of advancement; i.e., they are caused to move longitudinally of the glass bars, their behaviors are equal to those in the case of the above-described optical sensor 3.

Figure 5:
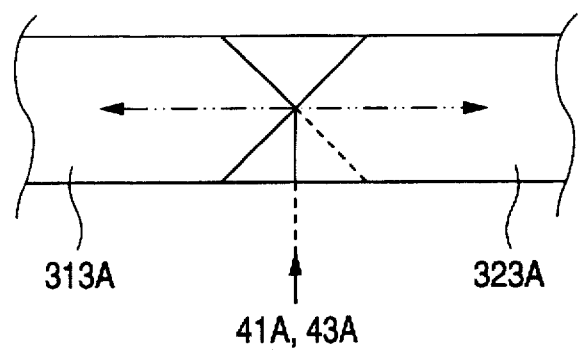
FIG. 5 is an enlarged diagram of the part of FIG. 4 which is indicated by the arrow P.

In order to eliminate the difficulty that the incident light beams 41A or 43A which has been linearly polarized is elliptically polarized by the first reflecting surface, it is necessary that the polarizing angle is in parallel with the reflecting surface; that is, the linearly polarized light beam in a direction perpendicular to the surface of the drawing of FIG. 5 is not affected in linear polarization. It may be considered that, while the incident light beam 41A travels a short distance in the Faraday effect glass bar 313A, the Faraday effect acts on it, so that the incident light beam is changed in the angle of polarization. However, in practice, the magnetic field strength in this direction is generally weak, and the height of the rectangular equilateral triangle in FIG. 5; that is, the distance between the light incident point and the light reflecting point causes no problem, being short. The angle of polarization of the incident light 41A depends on the polarizer 28A shown in FIG. 3. Merely by changing the mounting angle of the polarizer 28, the angle of linear polarization of the incident light beam 41A can be set to a desired value. Hence, with the optical sensor, the setting of the linearly polarized angle can be achieved with ease.

FIG. 5 is an enlarged diagram of a part of the optical sensor (in FIG. 4) as viewed in the direction of arrow P. In FIG. 5, the reflecting point A of the Faraday effect glass bar 323A is equal in position to the reflecting point F of the Faraday effect glass bar 313A. The incident light beams are reflected from the reflecting surfaces at those reflecting points, so that their directions of advancement are changed at right angles; that is, they are advanced right and left, thus finally emerging from the glass bars a the emergent light beams 42A and 44A, respectively. The vertical shift between the unitary Faraday effect glass bars 31A and 32A in FIG. 4 should be more than the thickness of the Faraday effect glass bars, because the rectangular equilateral triangles of the glass bars are overlapped with each other as shown in FIG. 5.

As is apparent from comparison of FIG. 4 with FIG. 1, the direction of advancement of the light beam in the optical sensor unit 32 of the optical sensor 3 is opposite to the direction of advancement of the light beam in the optical sensor unit 32A of the optical sensor 3A. Accordingly, the change in polarizing angle due to the Faraday effect in the former is also made opposite to the change in polarizing angle due to the Faraday effect in the latter. Hence, if, in FIG. 3, the relationships between the polarizer 28A and 28B and the analyzers 29A and 29B are made equal to those in the prior art, then the following problem is involved. That is, in the case where, in FIG. 1, the polarizing angle of the emergent light beam 42 of the optical sensor unit 32 is larger than that of the incident light beam 41, then in the optical sensor unit 32A in FIG. 4 is becomes smaller. Accordingly, if in the addition circuit 25 two signals are subjected to addition in the same way, the amounts of variation in polarizing angle which are proportional to the current under test are canceled out. Hence, in this case, the two signals are subjected to subtraction. Through the subtraction, the amounts of variations in polarizing angle are subjected to addition. Through the subtraction, AC components proportional to the current under test are subjected to addition; however, DC components are subjected to subtraction. Hence, after the subtraction of the signals, the ratio of DC component to AC component is small. Therefore, the DC components can be readily removed with the DC component removing filter 26. This is one of the merits of the optical sensor. On the other hand, in order to control the magnitude of the incident light beam, it is necessary to have the DC component to some extent. In this case, the two signals are subjected to addition, to eliminate the AC components, so that only the DC component remains.

It is assumed that the optical sensor 3A of FIG. 4 is applied to the optical current transformer of FIG. 3, and that the difference between the polarizing angle of the polarizer 28A and the polarizing angle of the analyzer 29A is +45°. If, in this case, the difference between the polarizing angle of the polarizer 28B and the polarizing angle of the analyzer 29B is made −45°, then the AC components in intensity of the output light beams of the analyzers 29A and 29B are equal in phase to each other, and therefore the adder 25 shown in the block diagram of FIG. 3, which is equal to the adder for the optical sensor 2 shown in FIG. 1, may be used. If, in contrast, the relationships between the polarizer 28A and 28B and the analyzers 29A and 29B are set reversed in angular difference similarly as in the above-described case, then the output electrical signals of the two photo-electric converters 24A and 24B are subjected to subtraction, so that the AC component can be obtained.

(Embodiment 3)

Figure 6:
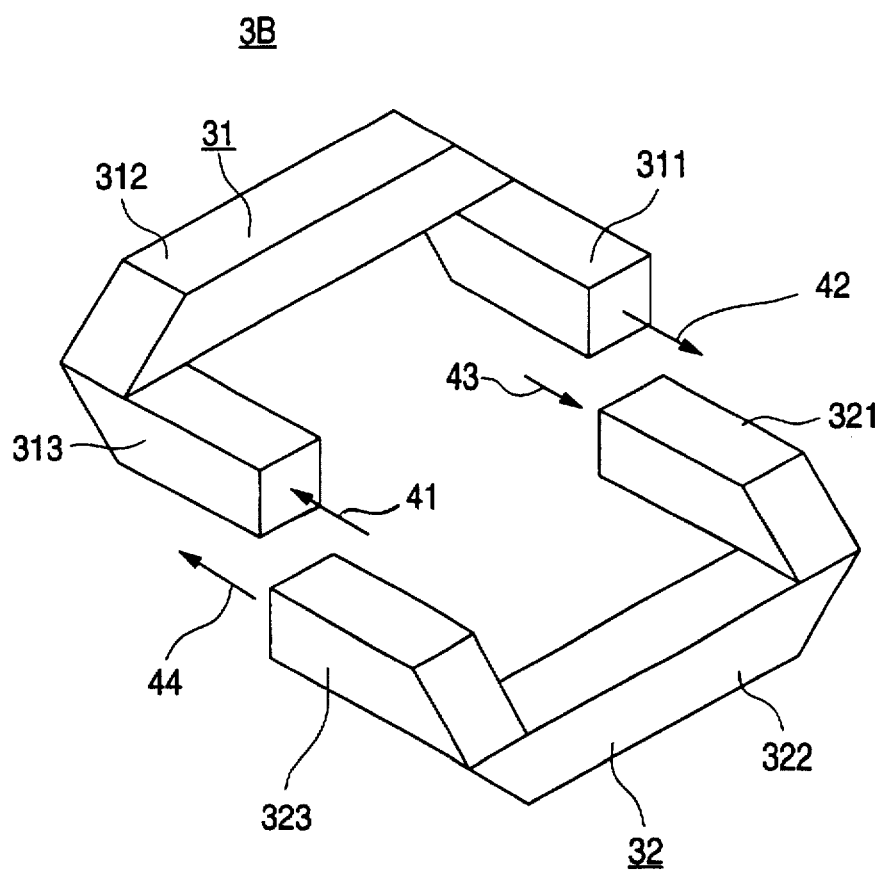
FIG. 6 is a perspective view of an optical sensor in another example of the optical current transformer, which constitutes a third embodiment of the invention.

FIG. 6 shows another example of the optical sensor, which constitutes a third embodiment of the invention. The optical sensor 3B is different from the optical sensor 3 shown in FIG. 1 in the relative position of its optical sensor units 31 and 32. That is, in the optical sensor 3 of FIG. 1, the optical sensor unit 32 is located above the optical sensor unit 31 in the direction of flow of a current under test; whereas in the optical sensor 3B of FIG. 6, the former 32 is located below the latter 31. For instance, in the optical sensor 3 of FIG. 1, the space in which the optical fiber to which the emergent light beam 44 is applied and the metal terminal of the optical fiber are arranged is provided between the Faraday effect glass bars 323 and 312, and is limited by the Faraday effect glass bar 31. On the other hand, in the case of the optical sensor 3B of FIG. 6, there is nothing present in the direction of advancement of the emergent light beam 44, and therefore the arrangement of the optical fiber and its metal terminal is not limited at all. This is one of the merits of the third embodiment. However, as is apparent from FIG. 2, the dimension of the optical sensor 3 measured in the direction of flow of the current under test is twice (two times) the thickness of the Faraday effect glass bar; whereas the dimension of the optical sensor 3B measured in the same way is four times that of the Faraday effect glass bar. That is, the optical sensor 3B is more bulky than the optical sensor 3. Hence, the optical sensor 3 or 3B should be employed separately according to the spatial limitations at the position where it is to be installed. On the other hand, it should be noted that the optical sensor units 31A and 32B of the optical sensor 3A shown in FIG. 4 may be arranged in the same manner as those in FIG. 6.

Figure 22:
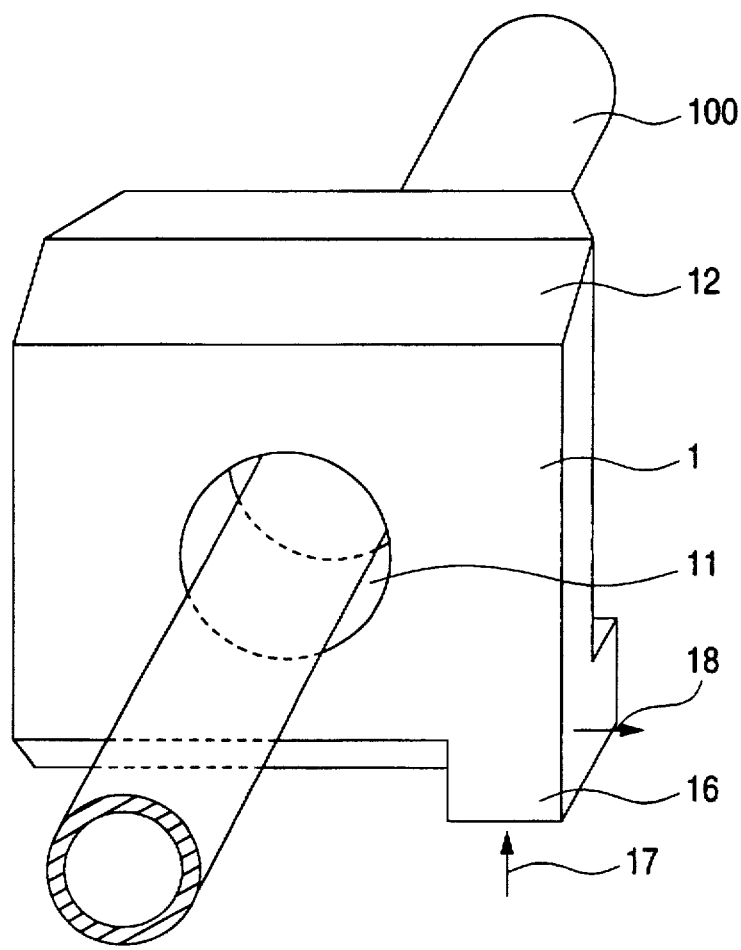
FIG. 22 is a perspective view of an optical sensor in a conventional optical current transformer.
Figure 23C:
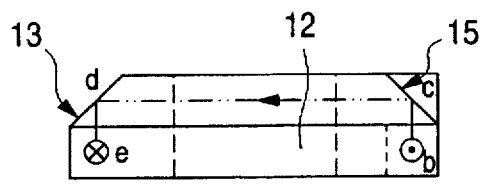
FIGS. 23B to 23E are side views thereof.
Figure 23D:
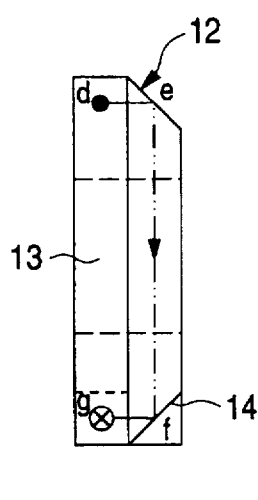
Figure 23A:
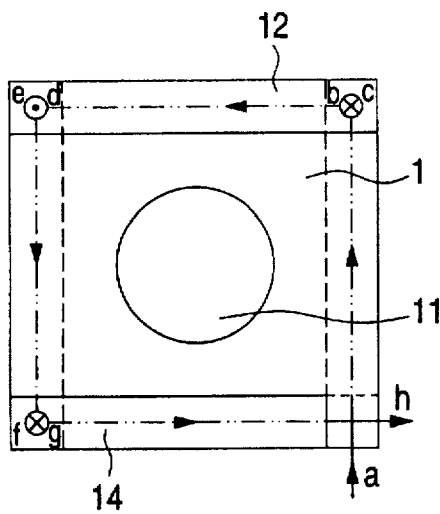
FIG. 23A is a plan view of the optical sensor, and the remaining
Figure 23B:
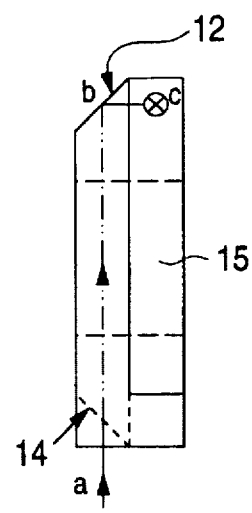
Figure 23E:
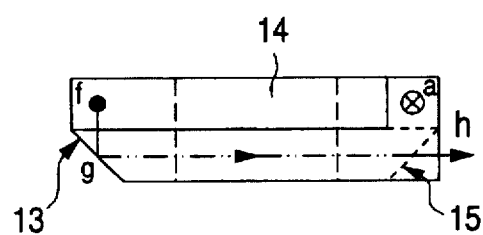

In the above-described embodiments, the Faraday effect glass bars are jointed together to form the optical sensor units and accordingly the optical sensor; however, the invention is not limited thereto or thereby. That is, the technical concept of the invention is applicable to an optical sensor which is formed by cutting a Faraday effect glass material as shown in FIGS. 22 and 23. That is, the light input/output section is eliminated from the lower right portion of the optical sensor shown in FIG. 22, and similarly as in the other corners the sloped surfaces 14 and 15 are extended from end to end, and are each cut into two parts vertically or horizontally in FIG. 22. One of the resultant sloped surfaces is turned upside down, and arranged spaced from the other as shown in FIG. 1 or 6. On the other hand, an optical sensor is known in the art in which only the reflecting regions provided at the corners of a rectangular optical path are formed by using other members. The technical concept of the invention may be applied to this conventional optical sensor, too. In addition, an optical sensor is available which is formed as follows: Four sides of a rectangular optical path are divided into L-shaped optical paths, and four optical sensor units corresponding to those L-shaped optical paths are combined together to form the aimed optical sensor. In this case, in FIG. 3, the numbers of light emitting units, optical fibers, and photo-electric converters must be each increased to four.

In the optical sensor of the first embodiment shown in FIG. 1, and in the optical sensor of the third embodiment shown in FIG. 6, the optical sensor units are equal in the direction of advancement of light; however, the optical sensor units may be arranged in the same way as those in the optical sensor 3A of the second embodiment in which the incidence of light is performed on the side of the incident light beam 44 in the figure, and the emergence of light is accomplished on the side of the emergent light beam 43. In addition, another system may be considered in which the incident light beam 43 is connected to the emergent light beam 42 with an optical fiber, and only the incident light beam 41 is employed as an incident light beam and the only the emergent light beam 44 is employed as an emergent light beam; however, the system is not practical, because, when passed through a bent optical fiber, the linearly polarized light beam is changed in polarization.

(Fourth Embodiment)

Figure 7:
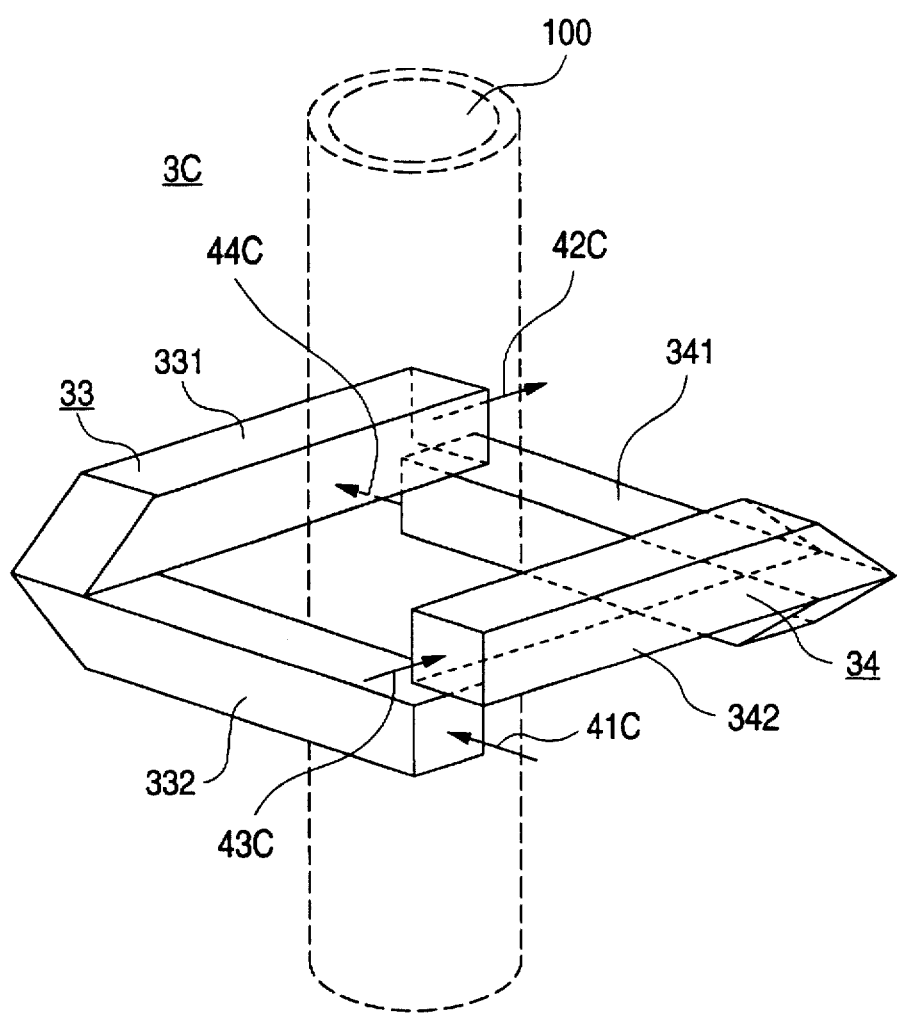
FIG. 7 is a perspective view showing another example of the optical sensor in the optical current transformer, which constitutes a fourth embodiment of the invention.
Figure 8C:
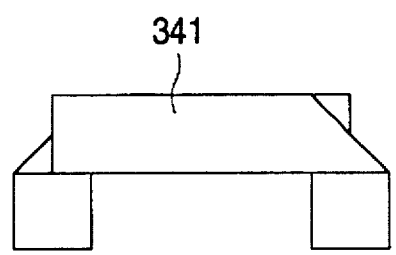
FIGS. 8B to 8E are side views.
Figure 8D:
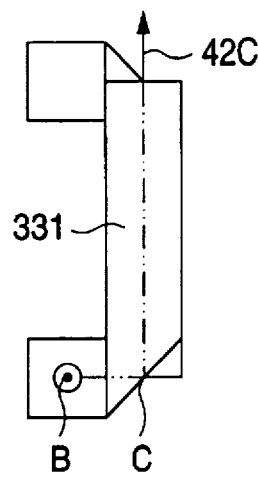
Figure 8A:
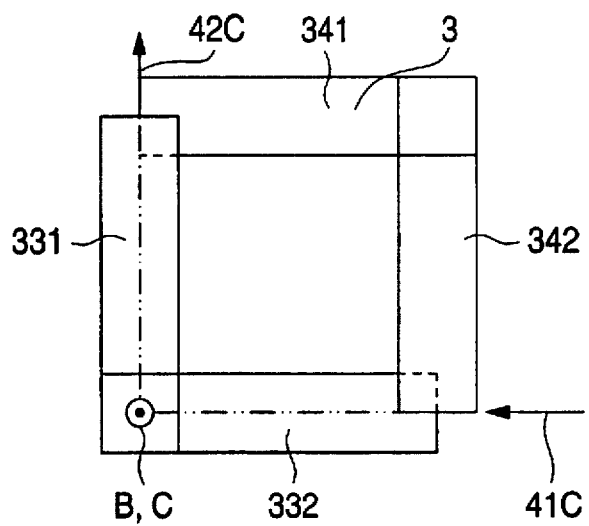
FIG. 8A is a plan view of the optical sensor, and the remaining
Figure 8B:
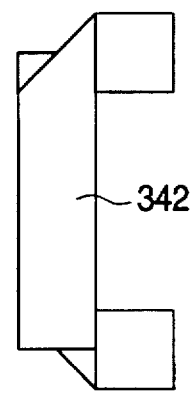
Figure 8E:
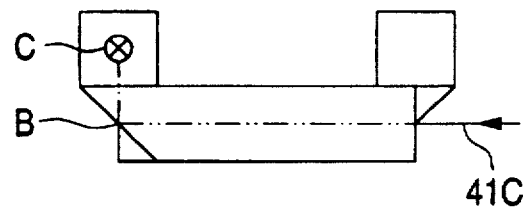

FIG. 7 is a perspective view showing another example of the optical sensor, which constitutes a fourth embodiment of the invention. In FIG. 7, parts corresponding functionally to those already described with reference to FIG. 1 are therefore designated by the same reference numerals or characters.

The optical sensor shown in FIG. 7 is different from the one shown in FIGS. 1 to 6 in the following point: That is, each of the optical sensors 3, 3A and 3B comprises the U-shaped optical sensor units which are made up of Faraday effect glass bars. That is, the Faraday effect glass bars, are arranged rectangular, and cut at two opposite sides of the rectangle, to obtain two U-shaped optical sensor units. On the other hand, in the fourth embodiment, optical sensor 3C shown in FIG. 7 comprises L-shaped optical sensor units which are made up of Faraday effect glass bars. Those Faraday effect glass bars are arranged rectangular, and cut at two opposite vertexes of the rectangle, to obtain the L-shaped optical sensor units.

The optical sensor 3C, as shown in FIG. 7, comprises two optical sensor units 33 and 34. The optical sensor unit 33 is made up of two Faraday effect glass bars 331 and 332. The junction of the two Faraday effect glass bars 331 and 332 serves as a twice total reflection section. The same think may be said about the other optical sensor units 34.

An incident light beam 41C is applied an optical-incident surface (not denoted by a reference numeral) which is the right end face of the Faraday effect glass bar 332 which is one of the end faces of the L-shaped optical sensor 33 and is perpendicular to the incident light beam 41C. The light beam 41C thus applied emerges, as an emergent light beam 42C, from the end face of the Faraday effect glass bar 331 which is the other end face of the L-shaped optical sensor unit 33. Similarly, the optical sensor unit 34 is made up of Faraday effect glass bars 341 and 342. An incident light beam 43C is applied an optical-incident surface (not denoted by a reference numeral) which is one end face of the Faraday effect glass bar 342. The light beam 43C thus applied emerges, as an emergent light beam 44C, from the end face of the Faraday effect glass bar 331 which is the other end face of the L-shaped optical sensor unit 34. The optical sensor units 33 and 34 are similar to each other; that is, they are equal in configuration and in dimension. They are different only in position.

The treatment of the two incident light beams 41C and 43C, and the two emergent light beams 42C and 44C are the same as in the above-described first through third embodiments.

FIG. 8 is a projection diagram of the optical sensor shown in FIG. 7. More specifically, FIG. 8A is a plan view of the optical sensor, and the remaining FIGS. 8B to 8E are side views of the same. The incident light beam 41C is applied to the Faraday effect glass bar 332. The light beam thus applied is totally reflected from the reflecting surface B, so that its direction of advancement is changed 90°, and then enters the Faraday effect glass bar 331, and advances longitudinally of the latter 331, being totally reflected from the reflecting surface C. Finally, the light beam merges, as an emergent light beam 42C, from the Faraday effect glass bar 331.

As shown in FIG. 8, the optical sensor units 33 and 34 are so arranged that, at the light incidence section, and at the light emergence section, the centers of the ends of the optical sensor units 33 and 34 are in alignment with each other. That is, the combination of the two optical sensors in this manner allows the Faraday effect glass bars to completely surround the conductor 100 as is apparent from the plan view, FIG. 8A. However, as was described with reference to the first embodiment, if the light incident positions, or the light emergence positions of the optical sensors units are shifted from each other, the result of measurement may be erroneous.

(Fifth Embodiment)

Figure 9:
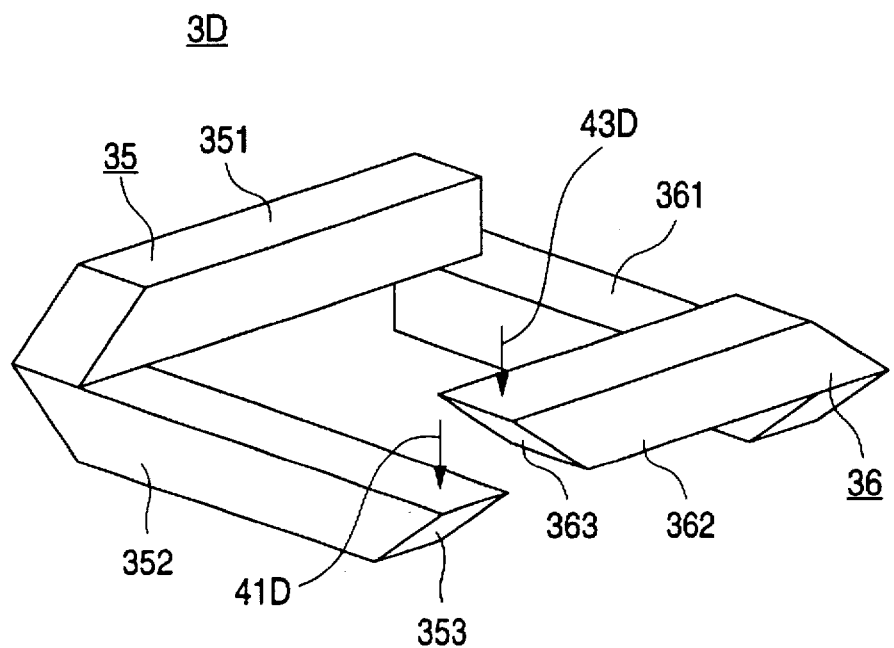
FIG. 9 is a perspective view showing another example of the optical sensor in the optical current transformer, which constitutes a fifth embodiment of the invention.
Figure 10:
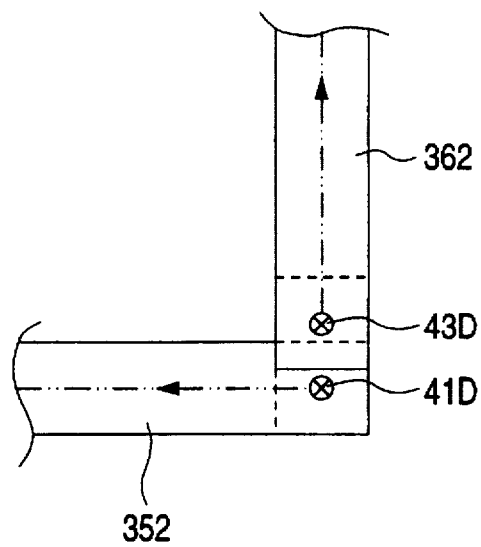
FIG. 10 is a plan view showing parts of light incidence sections of the optical sensor shown in FIG. 9.

FIG. 9 is a perspective view of another example of the optical sensor, which constitutes a fifth embodiment of the invention. FIG. 9 is similar to FIG. 7 except that the conductor 100 is not shown. FIG. 10 is a plan view of a part of the light incidence section of the optical sensor 3D shown in FIG. 9. That is, the part shown in FIG. 10 corresponds to the lower right part of FIG. 8A.

The optical sensor 3D comprises optical sensor units 35 and 36. The optical sensor 3D is different from the one shown in FIGS. 7 and 9 (the fourth embodiment) in the following point: Similarly as in the case of the second embodiment shown in FIGS. 4 and 5, at the light incidence sections of the optical sensor units 35 and 36, the ends of the Faraday effect glass bars are cut to form 45° reflecting surfaces 353 and 363, so that the incident light beam 41D and 43D are reflected from those reflecting surfaces 353 and 363. That is, the incident light beams 41D and 43D are equal in the direction of application. The fifth embodiment has the same effects or merits as the second embodiment.

The end portion of the Faraday effect glass bar 362 is slightly shifted from the incident light beam 41D as shown in FIG. 10 so that it may not obstruct the application of the incident light beam 41D to the Faraday effect glass bar 362. As a result, as is apparent from FIG. 10, the planar positions of the two incident light beams 41D and 43D are slightly shifted from each other. As was described before, in the case where the planar positions of two incident light beams applied to the optical sensor units are shifted, the result of measurement is erroneous. Hence, the application of the fifth embodiment should be made only where the error which may be involved in the result of measurement can be substantially disregarded.

(Sixth Embodiment)

Figure 11A:
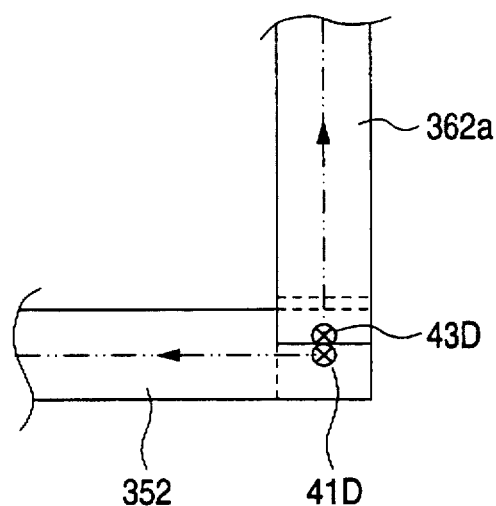
FIGS. 11A and FIG. 11B are enlarged plan views of light incidence sections of another example of the optical sensor in the optical current transformer, which constitutes a sixth embodiment which are different from the fifth embodiment shown in FIGS. 9 and 10.
Figure 11B:
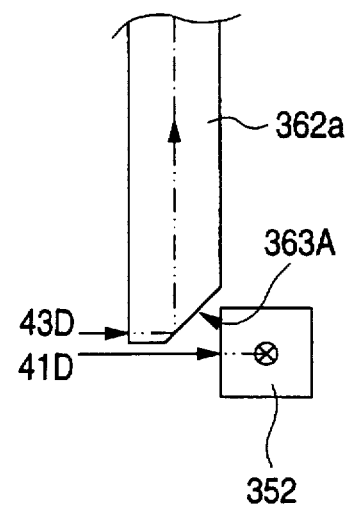

FIG. 11 is a plan view of part of the light incidence sections of another example of the optical sensor, which is a sixth embodiment of the invention.

The sixth embodiment is different from the fifth embodiment shown in FIGS. 9 and 10 in that the part of the Faraday effect glass bar which obstructs the application of the incident light beam 41D is removed. That is, the Faraday effect glass bar 362a corresponds to the Faraday effect glass bar 362a shown in FIG. 10; however, it should be noted that the 45° eloped end of the Faraday effect glass bar is partially removed, so that instead the planar position of the incident light beam 43D applied to the Faraday effect glass bar 362a is made closer to the incident light beam 41D applied to the Faraday effect glass bar 362 On the other hand, if, depending on the accuracies in planar position of the incident light beams 41D and 42D, the distance between the incident light beam 41D and the end of the Faraday effect glass bar 362a, and the distance of the same end of the latter and the planar position of the incident light beam 43D are decreased as much as possible, then the resultant optical sensor may be applied to the case where the error involved in the result of measurement cannot be disregarded as was described with reference to the sixth embodiment.

(Seventh Embodiment)

Figure 12:
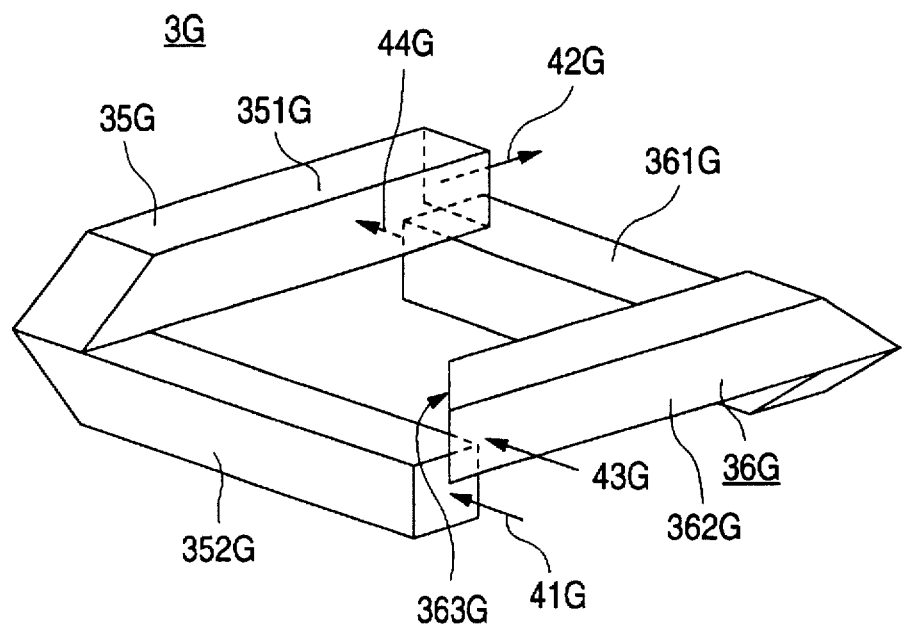
FIG. 12 is a perspective view showing another example of the optical sensor in the optical current transformer, which constitutes a seventh embodiment of the invention.
Figure 13:
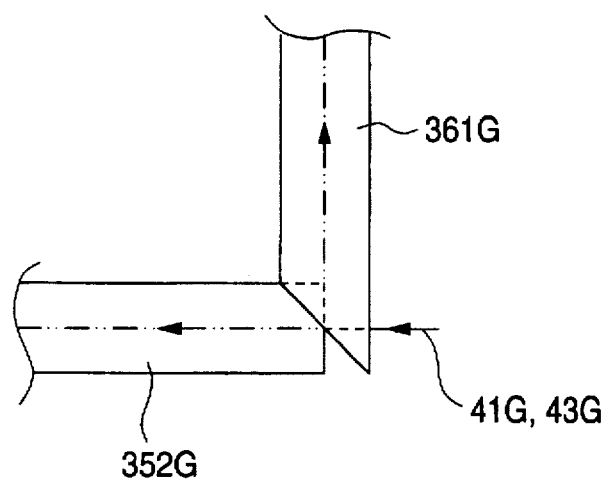
FIG. 13 is a plan view showing parts of light incidence sections of the optical sensor shown in FIG. 12.

FIG. 12 is a perspective view showing another example of the optical sensor, which constitutes a seventh embodiment of the invention. FIG. 13 is a plan view showing part of the light incidence sections of the optical sensor units shown in FIG. 12. In the seventh embodiment, the descriptions of its parts corresponding functionally to those already described with reference to the fifth embodiment shown in FIGS. 9 and 10, are therefore omitted. The seventh embodiment is different from the fifth embodiment in the following point: The light incidence surface of an optical sensor units 36G, which is one of two optical sensors units 36G and 36G forming the optical sensor 3G, similarly as in the case of the optical sensor unit 33 shown in FIG. 7, is perpendicular to the longitudinal direction of a Faraday effect glass bar 352G having this light incidence surface. On the other hand, the other optical sensor unit 36G has a Faraday effect glass bar 362G with a light incidence surface for an incident light beam. Similarly as in the case of the optical sensor units 35 and 36 in the fifth embodiment, the light incidence surface is in parallel with the longitudinal direction of the Faraday effect glass bar 362G. The other end of the Faraday effect glass bar 362G which is opposite to the light incidence surface is in parallel with the longitudinal direction of the Faraday effect glass bar 362G. The other end of the Faraday effect glass bar 362G which is opposite to the light incidence surface is sloped, thus providing a 45° reflecting surface 363G. The incident light beam 43G is applied to the Faraday effect glass bar 362G in the same direction as the incident light beam 41G. The light beam 43G thus applied is totally reflected by the reflecting surface 363G, so that it is allowed to advance in the longitudinal direction of the Faraday effect glass bar 362G. In FIG. 9, the incident light beam 430 advances downwardly to the Faraday effect glass bar 362, whereas in FIG. 12, the light incidence surface and the reflecting surface 363G are so set that the incident light beam 43G is able to enter the Faraday effect glass bar 362G from the side. With the optical sensor thus formed, two incident light beams 41G and 43G advance in the same direction. Hence, similarly as in the fifth embodiment, the optical fibers for leading the incident light beams 41G and 43G can be laid with ease. Furthermore, the seventh embodiment is superior to the fifth embodiment in that, as is apparent from FIG. 13, the planar positions of the incident light beams 41G and 34G applied to the optical sensor are aligned with each other. Hence, the seventh embodiment is free from the difficultly that, in the fifth embodiment, the planar positions of the incident light beams are shifted from each other.

(Eighth Embodiment)

Figure 14:
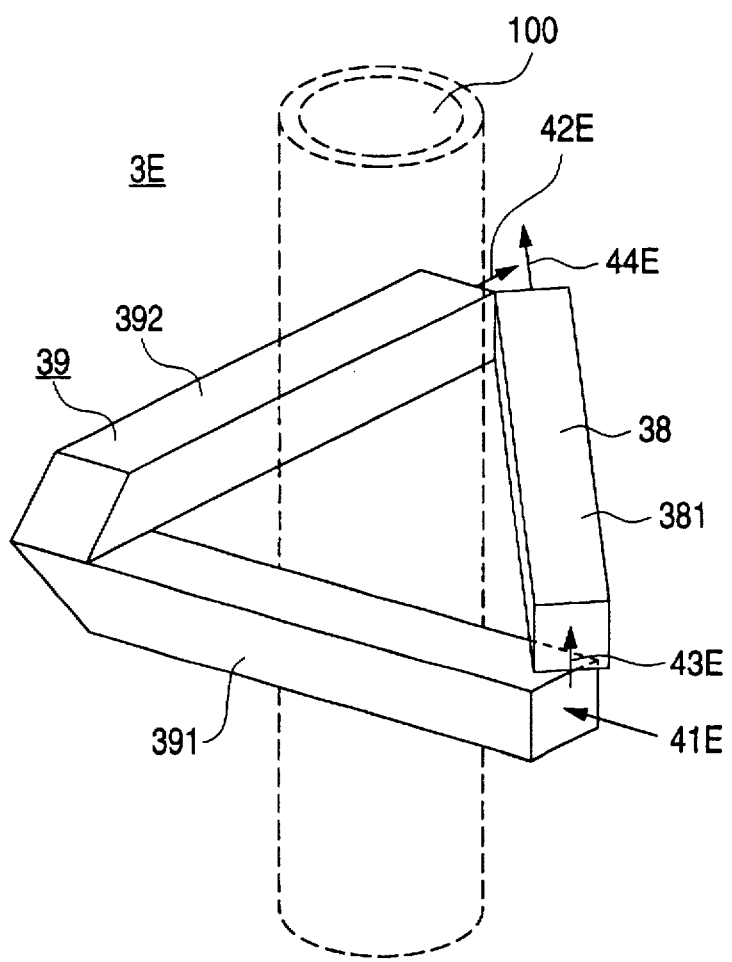
FIG. 14 is a perspective view showing another example of the optical sensor in the optical current transformer, which constitutes an eighth embodiment of the invention.

FIG. 14 is a perspective view of another example of the optical sensor, which constitutes an eighth embodiment of the invention. In the eighth embodiment, the detailed descriptions of its parts corresponding functionally to those already described with reference to the fourth embodiment shown in FIG. 22 are therefore omitted.

The optical sensor 3E is different from the above-described ones 3, 3A, 3B, 3C and 3D in that the optical sensor 3E provides a triangular optical path. This triangle is a right-angled triangle (as described in detail later). An optical sensor unit 38 corresponds to the oblique line of the triangle, and an optical sensor unit 39 correspond to two sides forming right angles That is, the optical sensor unit 38 is made up of one Faraday effect glass bar 381, while the optical sensor unit 39 is made up of two Faraday effect glass bars 391 and 392. The optical sensor unit 39 is fundamentally similar to the optical sensor unit 33. However, in order to form an optical path with the Faraday effect glass bars 381, 391 and 392 which surrounds the conductor 100 whose diameter is maintained unchanged, those Faraday effect glass bars 381, 291 and 392 must be longer than the Faraday effect glass bars 331, 332, 341 and 342. However, it should be noted that the sum of the lengths of the three Faraday effect glass bars 381, 391 and 392 is shorter than the sum of the lengths of the four Faraday effect glass bars 331, 332, 341 and 342.

A specific feature of the optical sensor 3E shown in FIG. 14 resides in that the twice total reflection occurs at only one position. In general, formation of a twice total reflection section is expensive. Hence, the number of positions where the twice total reflection occurs should be as small as possible. From this view point, it can be said that the optical sensor 3E shown in FIG. 14 is most economical, and the optical sensor 3C or 3D follows it which is cut at two opposite vertexes of the rectangular optical path.

FIG. 15 is a projection diagram of the optical sensor shown in FIG. 14. More specifically, FIG. 15A is a plan view of the optical sensor, and the remaining FIGS. 15B to 15E are side views of the same. In the eighth embodiment shown in FIG. 15, the detailed descriptions of its parts corresponding functionally to those already described with reference to the fourth embodiment shown in FIG. 8 are therefore omitted. FIG. 15 shows it more clearly than FIG. 14 that the optical sensor 3E is in the form of a right-angle triangle.

Figure 15C:
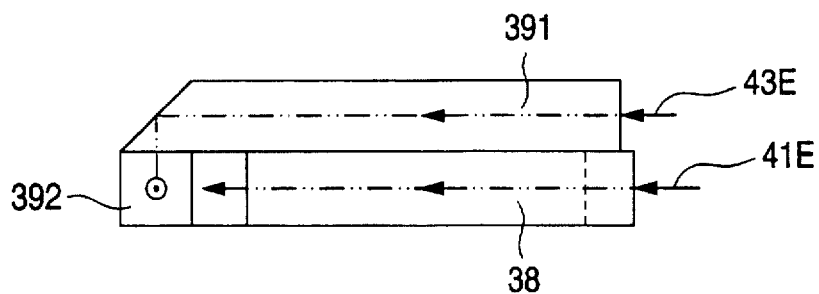
Figure 15D:
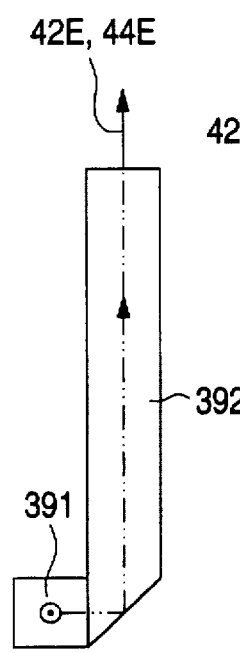
Figure 15A:
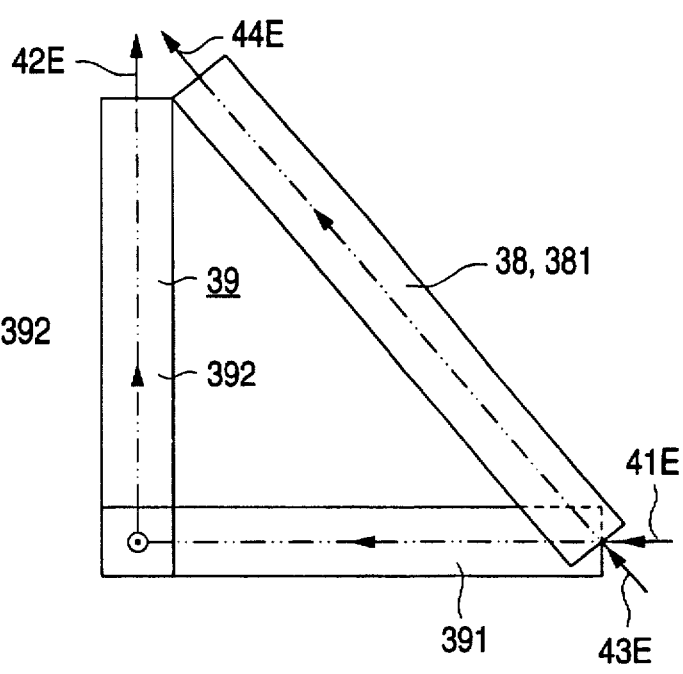
FIG. 15A is a plan view of the optical sensor, and the remaining
Figure 15B:
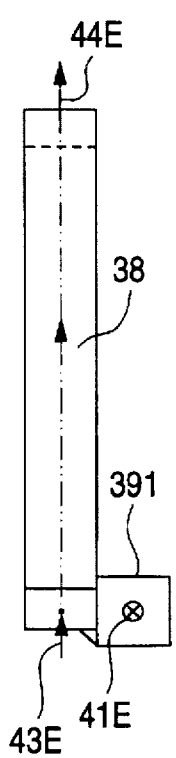
Figure 15E:
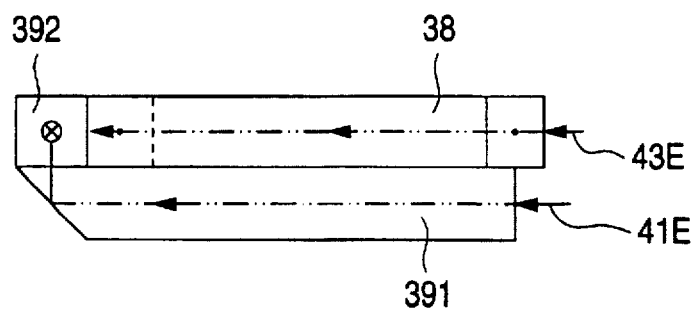

As is seen from FIG. 14, too, the Faraday effect glass bars 281 and 392 are on one and the same plane, and the Faraday effect glass bar 391 is shifted as much as the thickness of one Faraday effect glass bar from those bars. Hence, at the light incidence section (on the lower right side of the figure), the Faraday effect glass bars 381 and 391 can be laid on each other, so that the light incident positions of the incident light beams 41E and 43E are aligned with each other in the plan view (FIG. 15A). By placing the corners of the Faraday effect glass bars 381 and 392 in close contact with each other, the positions of emergence of the emergent light beams 42E and 44E can be made closet to each other. Hence, the positions of emergence of the light beams are substantially spaced from each other as much as the width of the Faraday effect glass bar. The distance between the positions of emergence of light beams is one of the causes of the measurement error, as was described before. In the case where the error due to the fact that the positions of emergence of light beams are spaced from each other cannot be disregarded, the optical sensor may be so modified that the light emergence section of the Faraday effect glass bar 381 is placed on the light emergence section of the Faraday effect glass bar 392. If, in this case, the light incidence sections are left as shown in the figure, the Faraday effect glass bar 381 appears slightly tilted in the side views, FIGS. 15B, 15C, and 15D. If the fact that the Faraday effect glass bar is slightly tilted obstructs the manufacture of the optical sensor, then the following method may be employed: That is, in FIG. 15A, the Faraday effect glass bar 381 is shifted in a direction perpendicular to the surface of the drawing as much as the thickness of the Faraday effect glass bar so that it may not interfere with the Faraday effect glass bar 392. This method makes it possible to align the positions of emergence of the two light beams.

(Ninth Embodiment)

Figure 16:
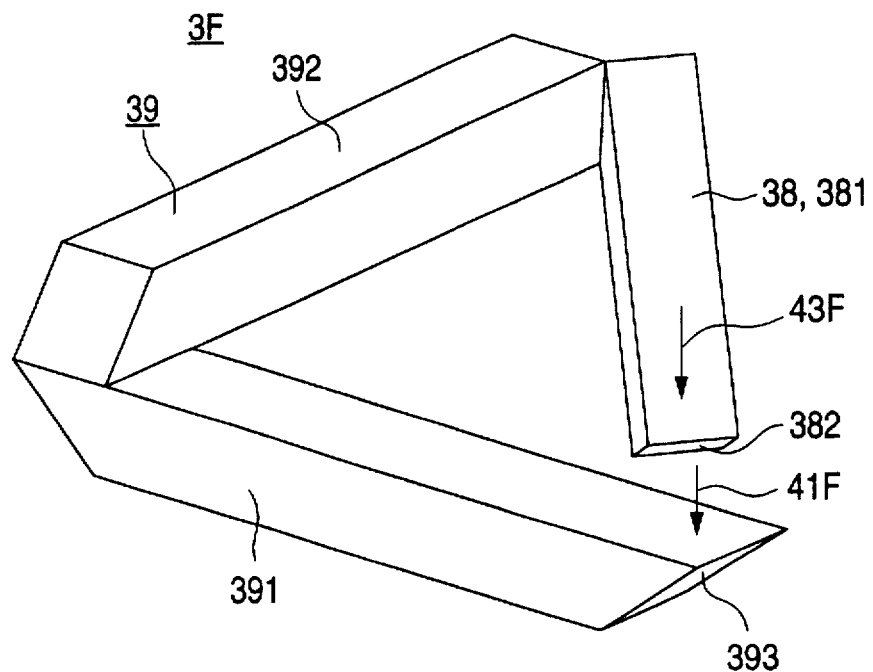
FIG. 16 is a perspective view showing another example of the optical sensor in the optical current transformer, which constitutes a ninth embodiment of the invention which is different from the eighth embodiment shown in FIGS. 14 and 15.
Figure 17A:
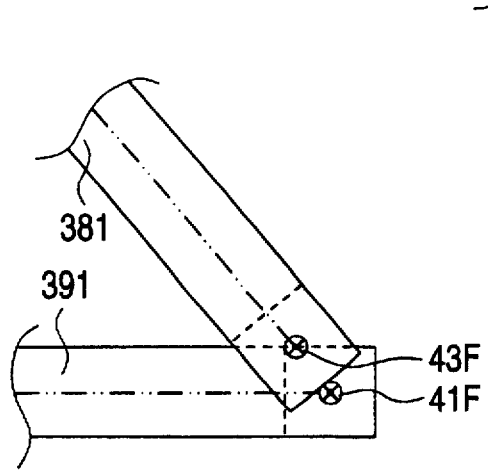
FIGS. 17A and 17B are a plan view and a side view, respectively, showing part of the light incidence sections of the optical sensor in FIG. 16.
Figure 17B:
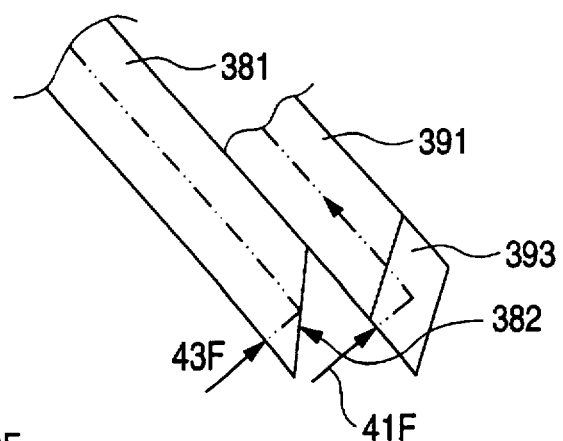

FIG. 16 is a perspective view of another example of the optical sensor, which is different from the one shown in FIGS. 14 and 15, thus constituting a ninth embodiment of the invention. FIG. 7A and 7B are a plan view and a side view, respectively, showing the light incidence section of the optical sensor shown in FIG. 16. The relation of the ninth embodiment to the eight embodiment are equal to that of the fifth embodiment to the fourth embodiment. Hence, application of the technical concept to the ninth embodiment that the sloped end of the Faraday effect glass bar is partially cut, allows the ninth embodiment to have the same effects or merits as the sixth embodiment.

(Tenth Embodiment)

Figure 18:
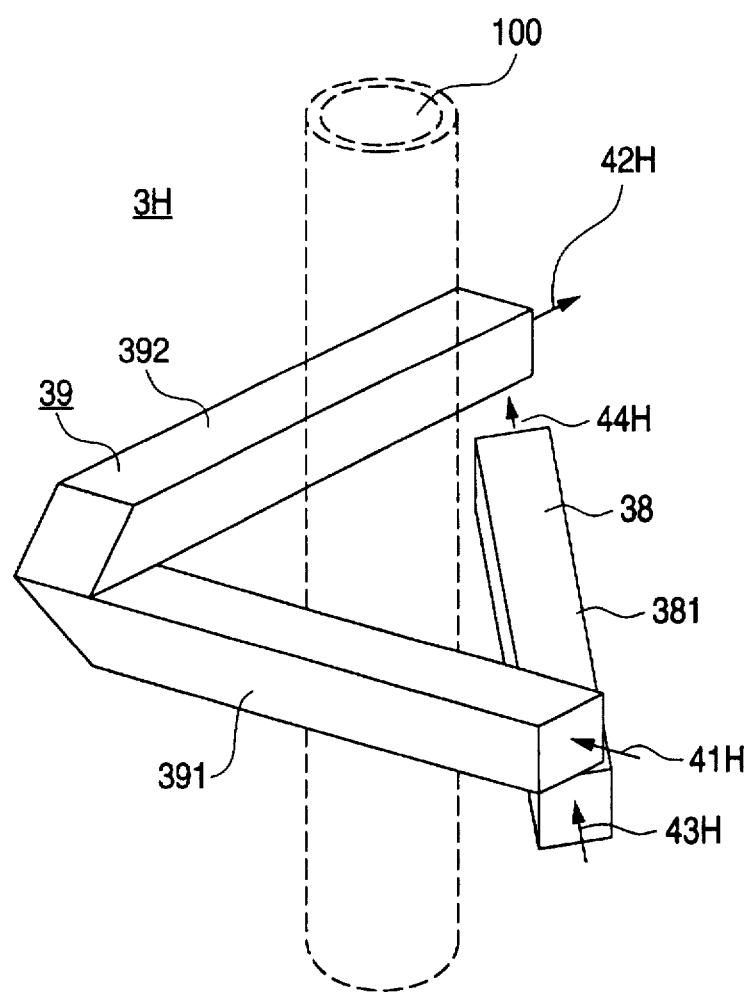
FIG. 18 is a perspective view showing another example of the optical sensor in the optical current transformer, which constitutes a tenth embodiment of the invention.

FIG. 18 is a perspective view of another example of the optical sensor, which constitutes a tenth embodiment of the invention. With respect to FIG. 18, detailed descriptions of parts corresponding functionally to those already described with reference to FIG. 14 (the eighth embodiment) are therefore omitted. The optical sensor 3H shown in FIG. 18 is different from the one 3E (the eight embodiment) shown in FIG. 14 in that three Faraday effect glass bars 381, 391 and 392 are laid one on another as follows. One end of the Faraday effect glass bar 392 is laid on one end of the Faraday effect glass bar 391, the other end of which is laid on one end of the Faraday effect glass bar 381.

FIG. 19 is a projection diagram of the optical sensor shown in FIG. 18. More specifically, FIG. 19A is a plan view of the optical sensor, and FIGS. 19B to 19E are side views of the same. With respect to FIG. 19, detailed descriptions of parts corresponding functionally to those already described with reference to FIG. 15 (the eighth embodiment) are omitted.

In the optical sensor 3H, the Faraday effect glass bar 381 forming an optical sensor unit 38, and the Faraday effect glass bars 391 and 392 forming an optical sensor unit 39 are laid around the conductor 100 in such a manner that they are arranged along the axis of the conductor 100 in the order of the Faraday effect glass bars 381, 391 and 392, so that the thickness of the resultant optical sensor is three times one Faraday effect glass bar. Hence, in the light incidence section (on the lower right side of FIG. 19), the Faraday effect glass bars 381 and 391 are laid on each other. Accordingly, the light incidence positions of the incident light beams 43H and 42H are in alignment with each other as viewed in the plan view (FIG. 19A). In addition, in the light emergence section (on the upper left side of FIG. 19), the Faraday effect glass bar 392 is laid above the Faraday effect glass bar 381. Accordingly, the light emergence positions of the emergent light beams 44H and 42H are also in alignment with each other as viewed in the plan view (FIG. 19A).

As was described above, in the optical sensor of the tenth embodiment, the light incidence positions of the two optical sensor units are in alignment with each other, and the light emergent positions thereof are also in alignment with each other. Hence, the optical paths of the two optical sensor units form a loop which completely surrounds the conductor 100 as viewed in a plane perpendicular to the axis of the conductor 100. Thus, with the optical sensor of the tenth embodiment, an optical current transformer can be provided which is free from the error which is due to the fact that the light incident positions of the two optical sensor units are not in alignment with each other, and the light emergent positions either are not in alignment with each other.

In the optical sensor shown in FIGS. 18 and 19, the Faraday effect glass bars 381, 191 and 392 are laid one on another in the stated order, in the direction of axis of the conductor 100 from the lower in FIG. 19, so that the thickness of the resultant optical sensor is three times the thickness of one Faraday effect glass bar. However, it may be so modified that those Faraday effect glass bars are laid in the order of the Faraday effect glass bars 391, 392, 381.

(Eleventh Embodiment)

Figure 20:
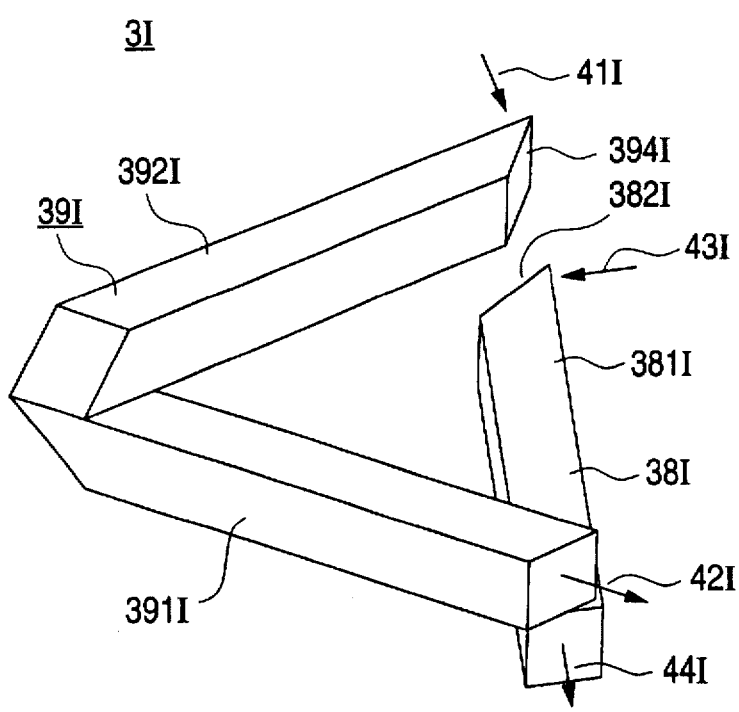
FIG. 20 is a perspective view showing another example of the optical sensor in the optical current transformer, which constitutes an eleventh embodiment of the invention.

FIG. 20 is a perspective view showing another example of the optical sensor, which constitutes an eleventh embodiment of the invention. With respect to FIG. 20, detailed descriptions of parts functionally corresponding to those which have been already described with reference to the tenth embodiment (FIG. 18) are omitted.

The optical sensor 3I shown in FIG. 20 is different from the one 3H shown in FIG. 19 in that the incident light beam 43I of an optical sensor unit 38I, and the incident light beam 41I of an optical sensor unit 39I are applied not only in directions perpendicular to the longitudinal directions of Faraday effect glass bars having the respective light incidence surfaces but also in directions perpendicular to the direction of axis of the conductor 100. That is, the incident light beams 43I and 41I change their directions of advancement immediately when applied to the Faraday effect glass bars 38lI and 392I. For this purpose, the Faraday effect glass bars 381I and 392I have 45° reflecting surfaces 392I and 394I at the ends, respectively. After the incident light beams 43I and 41I, being reflected by the reflecting surfaces 382I and 394I, advance longitudinally of the Faraday effect glass bars, the behaviors of those light beams are the same as those of the light beams in the optical sensor 3H shown in FIG. 18.

Similarly as in the case of the optical sensor 3H shown in FIG. 18, in the optical sensor 3I shown in FIG. 20 the Faraday effect glass bar 391I of the optical sensor unit 38I, and the Faraday effect glass bars 391I and 392I of the optical sensor unit 39I are laid one on another, in the stated order, in the direction of axis of the conductor 100 from the lower in FIG. 20, so that the thickness of the resultant optical sensor is three times the thickness of one Faraday effect glass bar. Hence, at the light incidence section, the Faraday effect glass bar 392I is laid above the Faraday effect glass bar 391I; and at the light emergence section, the Faraday effect glass bar 391I is laid on the Faraday effect glass bar 391I.

Figure 21:
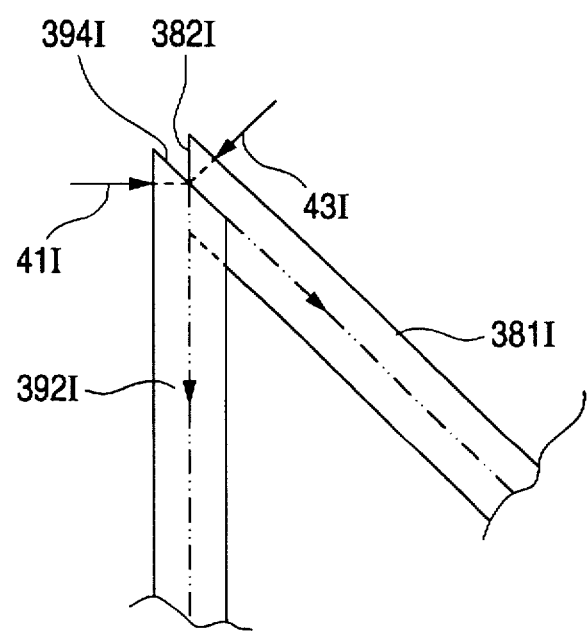
FIG. 21 is a plan view showing part of the light incidence sections of the optical sensor in FIG. 20.

FIG. 21 is a plan view showing part of the light incidence section of the optical sensor shown in FIG. 20. As shown in FIG. 21, in the light incidence section of the optical sensor 3I, the Faraday effect glass bar 392I is laid above the Faraday effect glass bar 391I, so that the light incidence positions of the incident light beams 41I and 43I are in alignment with each other. In the light emergence section (not shown) too, the Faraday effect glass bar 391I is laid on the Faraday effect glass bar 391I, so that the light emergent positions of the emergent light beams 42I and 44I are in alignment with each other.

AS is apparent from the above description, in the eleventh embodiment, the light incidence positions of the two optical sensor units are in alignment with each other, and the light emergent positions also are in alignment with each other. Hence, the optical paths of the two optical sensor units form a loop which completely surrounds the conductor 100 is viewed in a plane perpendicular to the axis of the conductor 100. Thus, with the optical sensor of the eleventh embodiment, an optical current transformer can be provided which is free from the error which is due to the fact that the light incident positions of the two optical sensor units are not in alignment with each other, and the light emergent positions either are not in alignment with each other.

In the optical sensor shown in FIGS. 20 and 21, the Faraday effect glass bars 391I, 391I and 392I are laid one on another in the stated order, while being shifted in the direction of axis of the conductor 100 from the lower in FIG. 20, so that thickness of the resultant optical fiber is three times thickness of one Faraday effect glass bar. However, it may be so modified that those Faraday effect glass bars are laid in the order of the Faraday effect glass bars 391I, 392I, 381I.

As was described above, in the optical current transformer of the invention, the optical path is divided into two parts, and the optical sensor is made up of two optical sensor units corresponding to the two parts of the optical path thus divided. And, a linearly polarized light beam is applied to each optical sensor unit, and polarized components proportional to the current which are included in the output light beams of the optical sensor units are subjected to addition, so that a measurement signal is obtained which is substantially equal that which is obtained with the optical sensor set around the conductor in which the current under test flows. The two optical sensor units are independent of each other, and therefore, it is unnecessary to precisely align the optical axes of the two optical sensor units with each other. Hence, the optical sensor units can be set around the conductor which has been kept fixed. This means that the optical current transformed can be coupled to electrical equipment which has been installed before, and can be removed therefrom with ease as the case may be. Furthermore, the optical sensor is made up of two U-shaped optical sensor units, in such a manner that the two optical sensor units are shifted a predetermined distance from each other in a predetermined direction. This arrangement provides spaces necessary for the incidence of light and for the emergence of light. Hence, in the optical current transformer, the optical fiber for leading the emergent light beam, and its metal terminal can be readily provided.

Moreover, the light incident surface of each optical sensor unit may be perpendicular to the respective side of the rectangular optical path; or it may be in parallel with the respective side of the rectangular optical path with Faraday effect glass bars having the light incident surfaces cut 45° at the ends which are opposite to the light incident surfaces, thus providing reflecting surfaces. In this case, the incident light beam is reflected from the reflecting surface so that i is advanced in parallel with the respective side of the rectangular optical path. In this case, too, the above-described effects or merits are obtained.

In the case of a rectangular optical path, the latter is cut at two diagonally opposite vertexes, so that two optical sensor units having L-shaped optical paths are formed. In this case, the number of twice total reflection sections is two which is a half of the number of twice total reflection sections of the optical current transformer made up of two U-shaped optical sensor units which are obtained by cutting two parallel (opposite) sides of the rectangular optical path. This feature will reduce the manufacturing cost of the optical sensor. If, in this case, the light incidence surface of each of the optical sensor units is perpendicular to the longitudinal direction of the Faraday effect glass bar having that light incidence surface, then the optical sensor unit will be simplest in structure, and can be manufactured with ease; that is, an optical sensor low in manufacturing cost can be provided.

In the case where the light incidence surface of one of the optical sensor units is perpendicular to the longitudinal direction of the Faraday effect glass bar having that light incidence surface, while the light incidence surface of the other optical sensor unit is in parallel with the longitudinal direction of the Faraday effect glass bar having that light incidence surface, and those Faraday effect glass bars have 45° reflecting surfaces on their ends which are opposite to the ends where the light incidence surfaces are formed, the directions of light incidence of the optical sensor units are in parallel with each other. This feature allows the optical fibers to be laid with ease. In addition, in the case where the light incidence surfaces of the optical sensor units are in parallel with the longitudinal directions of the Faraday effect glass bars having the light incidence surfaces, and those Faraday effect glass bars have 45° reflecting surfaces on their ends which are opposite to the ends where the light incidence surfaces are provided, the incident light beam applied to each Faraday effect glass bar is changed in the direction of advancement being reflected by the reflecting surface. In this case, similarly as in the above-described case, the directions of light incidence of the optical sensor units are in parallel with each other, and therefore the optical sensor has the same effects or merits.

In the case where the optical path of the optical sensor is in the form of a right-angled triangle, and the optical sensor is formed with the optical sensor unit which corresponds to the two sides of the right-angled triangle which form right angles, and the optical sensor unit which corresponds to the oblique line of the right-angled triangle, the twice total reflection occurs at only one position. Hence, the resultant optical sensor is lower in the manufacturing cost than the one whose optical path is rectangular.

The optical path may be substantially in the form of a rectangular equilateral triangle. If, in this case, the section of the conductor, around which the optical path is formed, is substantially circular or square, the amount of Faraday effect glass material to be used for manufacture is least; that is, the employment of the optical path which is substantially in the form of a rectangular equilateral triangle provides the optical sensor which is low in manufacturing cost.

In the case where the light incidence surfaces of the optical sensors are perpendicular to the longitudinal directions of the Faraday effect glass bars having those light incidence surfaces, similarly as in the case where the optical path is rectangular the optical sensor units are most effectively simplified, and can be manufacture with ease. This feature makes it possible to provide an optical sensor low in manufacturing cost.

In the case where, in the optical sensor whose optical path is in the from of a right-angled triangle, the light incidence surfaces of the optical sensor units are in parallel with the longitudinal directions of the Faraday effect glass bars having those light incidence surface, and those Faraday effect glass bars have 45° reflecting surfaces on their ends which are opposite to the ends where the light incidence surfaces are provided, the incident light beam applied to each Faraday effect glass bar, being reflected by the reflecting surface, is changed in the direction of advancement, so that is advances longitudinally of the Faraday effect glass bar. In this case, too, the directions of application of light beams to the optical sensor units are in parallel with each other, and therefore the optical sensor has the same effects or merits.

In the case where the optical path is rectangular, or right-angled triangular, and the 45° sloped end of one of the Faraday effect glass bars is positioned to intercept the incident light beam which is applied to the other Faraday effect glass bar, the cutting of a part of the sloped end makes it possible for the planar positions of the incident light beams applied to the optical sensor units to approach each other. This feature contributes to minimization of the measurement errors.

What is claimed is:

1. An optical current transformer comprising:
    an optical sensor made up of Faraday effect glass bars, thus forming a rectangular optical path which surrounds a conductor in which a current to be measured flows;
    a light emitting unit for emitting a light beam, the light beam being converted into a linearly polarized light beam through a polarizer and being applied to said optical sensor; and
    a detector which receives an emergent light beam through an analyzer from said optical sensor, and outputs an electrical signal proportional to the current to be measured, wherein
    the optical path is divided into parts,
    said optical sensor including at least two optical sensor units which form the parts of the optical path thus divided,
    a linearly polarized light beam is applied to each optical sensor unit, and
    polarized components proportional to the current which are included in the output light beams of said optical sensor units are subjected to addition, to obtain a measurement signal.

2. The optical current transformer of claim 1, wherein
two opposite sides of the rectangular optical path are cut to obtain two U-shaped optical paths, the two U-shaped optical paths being made up of optical sensor units which are independent of each other, and said optical sensors units are arranged so that said optical sensor units are shifted a predetermined distance from each other in a predetermined direction.

3. The optical current transformer of claim 2, wherein the light incident surface of each of said optical sensor units is perpendicular to the longitudinal direction of a Faraday effect glass bar having the light incident surface.

4. The optical current transformer of claim 2, wherein the light incident surface of each of said optical sensor units is in parallel with the longitudinal direction of a Faraday effect glass bar having the light incident surface, and the light incident surfaces are cut by an angle of 45° at the ends which are opposite to the light incident surfaces.

5. The optical current transformer of claim 1, wherein two L-shaped optical paths which are obtained by cutting two diagonally opposite vertexes of the rectangular optical path correspond to said optical sensor units which are independent of each other.

6. The optical current transformer of claim 5, wherein the light incidence surfaces of said optical sensor units are perpendicular to the longitudinal directions of Faraday effect glass bars having the light incidence surfaces.

7. The optical current transformer of claim 5, wherein a light incidence surface of one of said optical sensor units is perpendicular to the longitudinal direction of a Faraday effect glass bar having the light incidence surface, while a light incidence surface of the other optical sensor unit is in parallel with the longitudinal direction of a Faraday effect glass bar having the light incidence surface, and said Faraday effect glass bar of which the light incidence surface is in parallel with the longitudinal direction of said Faraday effect glass bars having the light incidence surface, has an end cut 45° which is opposite to the end where the light incidence surface is provided, so that said optical sensor units are equal in light incidence direction to each other.

8. The optical current transformer of claim 5, wherein the light incidence surfaces of said optical sensor units are in parallel with the longitudinal directions of Faraday effect glass bars having the light incidence surfaces, and those Faraday effect glass bars have 45° reflecting surfaces on ends thereof which are opposite to the ends thereof where the light incidence surfaces are provided, so that the incidence light beam applied to each of said Faraday effect glass bar is advanced longitudinally of said Faraday effect glass bar being reflected by the reflecting surface, whereby the incident light beams of said optical sensor units are equal in direction to each other.

9. The optical current transformer of claim 8, wherein a 45° end portion of a Faraday effect glass bar is partially cut which is so positioned as to intercept one of two incident light beams which advance in the same direction.

10. The optical current transformer of claim 1, wherein the optical paths of the optical sensor units are independent of each other.

11. The optical current transformer of claim 1, wherein both of the optical sensor units have a light incident end and a light emergent end, said light incident end and said light emergent end being separate from one another, and said linearly polarized light beams are applied to the respective light incident ends of said optical sensor units, and said emergent light beams exit said optical sensor units at respective light emergent ends.

12. An optical current transformer comprising:

an optical sensor made up of Faraday effect glass bars, thus forming an optical path which surrounds a conductor in which a current to be measured flows;

a light emitting unit for emitting a light beam, the light beam being converted into a linearly polarized light beam through a polarizer and being applied to said optical sensor; and a detector which receives an emergent light beam through an analyzer from said optical sensor, and outputs an electrical signal proportional to the current to be measured, wherein the optical path is in the form of a right-angled triangle, said optical sensor includes a first optical sensor unit whose optical path corresponds to two sides of said right-angled triangle which form right angles, and a second optical sensor unit whose optical path corresponds to the oblique line of said right-angled triangle, linearly polarized light beams are applied to said optical sensor units, respectively, and polarization components which are contained in emergent light beams of said optical sensor units and are proportional to a current to be measured are subjected to addition, to obtain a measurement signal.

13. The optical current transformer of claim 12, wherein light incidence surfaces of said optical sensor units are perpendicular to the longitudinal directions of Faraday effect glass bars having said light incidence surfaces.

14. The optical current transformer of claim 12, wherein light incidence surfaces of said optical sensor units are in parallel with to the longitudinal directions of Faraday effect glass bars having said light incidence surfaces, and those Faraday effect glass bars have 45° reflecting surfaces on ends thereof which are opposite to the ends thereof where said light incidence surfaces are provided, so that said incident light beam applied to each Faraday effect glass bar is advanced longitudinally of said Faraday effect glass bar being reflected by said reflecting surface, whereby said incident light beams of said optical sensor units are equal in direction with each other.

15. The optical current transformer of claim 14, wherein a 45° end portion of a Faraday effect glass bar is partially cut which is so positioned as to intercept one of two incident light beams which advance in the same direction.

16. The optical current transformer of claim 12, wherein the optical paths of the optical sensor units are independent of each other.

17. The optical current transformer of claim 12, wherein both of the optical sensor units have a light incident end and a light emergent end, said light incident end and said light emergent end being separate from one another, and said linearly polarized light beams are applied to the respective light incident ends of said optical sensor units, and said emergent light beams exit said optical sensor units at respective light emergent ends.

18. An optical current transformer comprising:

an optical sensor made up of Faraday effect glass bars, thus forming an optical path which surrounds a conductor in which a current to be measured flows;

a light emitting unit for emitting a light beam, the light beam being converted into a linearly polarized light beam through a polarizer and being applied to said optical sensor; and a detector which receives an emergent light beam through an analyzer from said optical sensor, and outputs an electrical signal proportional to the current to be measured, wherein the optical path is in the form of a equilateral triangle, said optical sensor includes a first optical sensor unit whose optical path corresponds to two sides of said triangle, and a second optical sensor unit whose optical path corresponds to a third side of said triangle, linearly polarized light beams are applied to said optical sensor units, respectively, and polarization components which are contained in emergent light beams of said optical sensor units and are proportional to a current to be measured are subjected to addition, to obtain a measurement signal.

19. The optical current transformer of claim 18, wherein light incidence surfaces of said optical sensor units are perpendicular to the longitudinal directions of Faraday effect glass bars having said light incidence surfaces.

20. The optical current transformer of claim 18, wherein light incidence surfaces of said optical sensor units are in parallel with to the longitudinal directions of Faraday effect glass bars having said light incidence surfaces, and those Faraday effect glass bars have 45° reflecting surfaces on ends thereof which are opposite to the ends thereof where said light incidence surfaces are provided, so that said incident light beam applied to each Faraday effect glass bar is advanced longitudinally of said Faraday effect glass bar being reflected by said reflecting surface, whereby said incident light beams of said optical sensor units are equal in direction with each other.

21. The optical current transformer of claim 20, wherein a 45° end portion of a Faraday effect glass bar is partially cut which is so positioned as to intercept one of two incident light beams which advance in the same direction.

22. The optical current transformer of claim 18, wherein the optical paths of the optical sensor units are independent of each other.

23. The optical current transformer of claim 18, wherein both of the optical sensor units have a light incident end and a light emergent end, said light incident end and said light emergent end being separate from one another, and said linearly polarized light beams are applied to the respective light incident ends of said optical sensor units, and said emergent light beams exit said optical sensor units at respective light emergent ends.

* * * * *

UNITED STATES PATENT AND TRADEMARK OFFICE
CERTIFICATE OF CORRECTION

PATENT NO. : 5,780,845
DATED : July 14, 1998
INVENTOR(S) : Koide et al.

It is certified that error appears in the above-identified patent and that said Letters Patent is hereby corrected as shown below:

On the face of the patent, Section [75] Inventors, delete "Urayasu" and insert --Chiba--.

On the face of the patent, under Other Publications, for the first reference, delete "Seisakushi" and insert --Seisakusho--.

Column 1, line 56, after "optical", insert --sensor--.

Column 1, line 64, delete "and" and insert --to--.

Column 2, line 37, delete "12" and insert --13--.

Column 4, line 36, after "light", insert --beam--.

Column 5, line 10, delete "the" (second occurance) and insert --their--.

Column 8, line 17, delete "aces" and insert --axes--.

Column 8, line 44, delete "33" and insert --44--.

Column 9, line 10, delete "32" and insert --43--.

Column 9, line 23, after "emerge", insert --,-- (comma).

UNITED STATES PATENT AND TRADEMARK OFFICE
CERTIFICATE OF CORRECTION

PATENT NO. : 5,780,845
DATED : July 14, 1998
INVENTOR(S) : Koide et al.

It is certified that error appears in the above-identified patent and that said Letters Patent is hereby corrected as shown below:

Column 9, line 23, delete "33" and insert --44--.

Column 9, line 51, delete "23A" and insert --24A--.

Column 9, line 53, delete "subjected" and insert --applied--.

Column 9, line 53, after "to", insert --an--.

Column 10, line 13, delete "3" and insert --3A--.

Column 10, line 13, delete "FIG. 1" and insert --FIG. 4 is different from the optical sensor 3 showwn in FIG. 1--.

Column 13, line 12, delete "think" and insert --thing--.

Column 14, line 3, delete "9" and insert --8--.

Column 14, line 16, delete "362" and insert --352--.

Column 14, line 40, delete "362" and insert --352--.

Column 14, line 42, delete "42D" and insert --43D--.

Column 14, line 60, delete "36G" and insert --35G--.

UNITED STATES PATENT AND TRADEMARK OFFICE
CERTIFICATE OF CORRECTION

PATENT NO. : 5,780,845
DATED : July 14, 1998
INVENTOR(S) : Koide et al.

Page 3 of 4

It is certified that error appears in the above-identified patent and that said Letters Patent is hereby corrected as shown below:

```
Column 14, line 61, delete "36G" and insert --35G--.

Column 15, line 15, delete "430" and insert --43D--.

Column 15, line 53, delete "291" and insert --391--.

Column 16, line 11, delete "281" and insert --381--.

Column 17, line 21, delete "42H" and insert --41H--.

Column 17, line 44, delete "FIG. 19" and insert
    --FIG. 18--.

Column 17, line 57, delete "FIG. 19" and insert
    --FIG. 18--.

Column 17, line 67, delete "392I" and insert --382I--.

Column 18, line 8, delete "391I" and insert --381I--.

Column 18, line 16, delete "391I" and insert --381I--.

Column 18, line 17, delete "391I" and insert --381I--.
```

UNITED STATES PATENT AND TRADEMARK OFFICE
CERTIFICATE OF CORRECTION

PATENT NO. : 5,780,845
DATED : July 14, 1998
INVENTOR(S) : Koide et al.

It is certified that error appears in the above-identified patent and that said Letters Patent is hereby corrected as shown below:

Column 18, line 22, delete "391I" and insert --381I--.

Column 18, line 26, delete "391I" and insert --381I--.

Column 18, line 43, delete "391I" and insert --381I--.

Column 19, line 18, delete "i" and insert --it--.

Column 20, line 29, delete "is" and insert --it--.

Signed and Sealed this

Seventeenth Day of November, 1998

Attest:

BRUCE LEHMAN

Attesting Officer

Commissioner of Patents and Trademarks